US012757740B2

(12) United States Patent
Xie et al.

(10) Patent No.: US 12,757,740 B2
(45) Date of Patent: Oct. 6, 2026

(54) SINGLE LAYER AND MULTILAYER MAGNETIC INDUCTORS BETWEEN SUBSTRATE CORES

(71) Applicant: Intel Corporation, Santa Clara, CA (US)

(72) Inventors: Jianyong Xie, Chandler, AZ (US); Andrew P. Collins, Chandler, AZ (US); Arghya Sain, Chandler, AZ (US); Sivaseetharaman Pandi, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 518 days.

(21) Appl. No.: 17/561,726

(22) Filed: Dec. 24, 2021

(65) Prior Publication Data

US 2023/0207494 A1 Jun. 29, 2023

(51) Int. Cl.

| | |
|---|---|
| ***H10W 44/00*** | (2026.01) |
| ***H01F 17/00*** | (2006.01) |
| ***H01F 27/28*** | (2006.01) |
| ***H05K 1/02*** | (2006.01) |
| ***H05K 1/03*** | (2006.01) |
| ***H05K 1/16*** | (2006.01) |

(Continued)

(52) U.S. Cl.

CPC ...... *H10W 44/501* (2026.01); *H01F 27/2804* (2013.01); *H05K 1/0306* (2013.01); *H05K 1/165* (2013.01); *H10D 1/20* (2025.01); *H10W 20/497* (2026.01); *H10W 70/635* (2026.01); *H10W 70/692* (2026.01); *H01F 2017/0066* (2013.01); *H01F 2017/008* (2013.01); *H05K 1/0221* (2013.01)

(58) Field of Classification Search

CPC ............... H01L 23/645; H01L 23/5227; H01L 2223/64; H01L 2223/6638; H01L 2223/6616; H10F 1/20; H05K 1/165; H05K 1/0221; H05K 1/0306; H01F 17/0006; H01F 2017/0066; H01F 2017/008; H01F 2017/0006; H10W 70/692; H10W 20/497

See application file for complete search history.

(56) References Cited

U.S. PATENT DOCUMENTS 5,282,312 A 2/1994 DiStefano
6,426,551 B1 * 7/2002 Kawakami ............ H05K 1/162 361/321.1

(Continued)

FOREIGN PATENT DOCUMENTS

WO WO 2021/055030 3/2021

OTHER PUBLICATIONS

Search Report from European Patent Application No. 22205731.7, mailed Jun. 13, 2023, 7 pgs.

(Continued)

*Primary Examiner* — David A Zarneke
(74) *Attorney, Agent, or Firm* — Schwabe, Williamson & Wyatt, P.C.

(57) ABSTRACT

Embodiments disclosed herein include electronic packages. In an embodiment, an electronic package comprises a first layer that comprises glass. In an embodiment, a second layer comprising glass is over the first layer. In an embodiment, the electronic package further comprises an inductor between the first layer and the second layer.

13 Claims, 24 Drawing Sheets

(51) Int. Cl.

| | |
|---|---|
| ***H10D 1/20*** | (2025.01) |
| ***H10W 20/40*** | (2026.01) |
| ***H10W 70/63*** | (2026.01) |
| ***H10W 70/692*** | (2026.01) |

(56) References Cited

U.S. PATENT DOCUMENTS

| | | | | |
|---|---|---|---|---|
| 11,735,535 | B2* | 8/2023 | Radhakrishnan | H01F 17/0013 257/668 |
| 12,327,794 | B2 | 6/2025 | Kamgaing | |
| 2014/0355228 | A1 | 12/2014 | Shi | |
| 2015/0201495 | A1* | 7/2015 | Kim | H05K 1/141 174/255 |
| 2015/0302974 | A1* | 10/2015 | Zhao | H01F 17/0013 336/200 |
| 2017/0086295 | A1* | 3/2017 | Erturk | H05K 1/162 |
| 2017/0194248 | A1 | 7/2017 | Das | |
| 2020/0152562 | A1 | 5/2020 | Iwai et al. | |
| 2020/0350234 | A1 | 11/2020 | Shan | |
| 2021/0111478 | A1 | 4/2021 | Kim | |
| 2021/0202353 | A1 | 7/2021 | Jhong | |
| 2022/0293327 | A1 | 9/2022 | Ganesan | |
| 2022/0406736 | A1* | 12/2022 | Marin | H10D 1/20 |
| 2023/0090759 | A1* | 3/2023 | Pietambaram | H10W 44/501 257/678 |
| 2023/0162902 | A1* | 5/2023 | Ahmed | H01F 27/022 336/90 |
| 2024/0274482 | A1 | 8/2024 | Hu | |
| 2024/0332100 | A1* | 10/2024 | Mishra | H10W 44/501 |
| 2025/0089173 | A1* | 3/2025 | Kuo | H05K 1/165 |
| 2025/0105145 | A1* | 3/2025 | Liu | H10W 20/497 |
| 2025/0126711 | A1* | 4/2025 | Lee | H05K 1/18 |
| 2026/0123482 | A1* | 4/2026 | Chiu | H10W 70/65 |

OTHER PUBLICATIONS

Office Action from U.S. Appl. No. 17/561,722, mailed Feb. 27, 2025, 12 pgs.

Notice of Allowance from U.S. Appl. No. 17/561,722, mailed Jul. 28, 2025, 10 pgs.

Office Action from U.S. Appl. No. 17/561,730, mailed Jul. 28, 2025, 9 pgs.

Office Action from U.S. Appl. No. 17/561,730, mailed Nov. 12, 2025, 8 pgs.

Notice of Allowance from U.S. Appl. No. 17/561,730, mailed Feb. 12, 2026, 5 pgs.

* cited by examiner

SINGLE LAYER AND MULTILAYER MAGNETIC INDUCTORS BETWEEN SUBSTRATE CORES

TECHNICAL FIELD

Embodiments of the present disclosure relate to electronic packages, and more particularly to electronic packages with low loss routing and inductors for power delivery between glass cores in the package substrate. Packages for the purposes of this disclosure can apply to electronic package substrates, space or pitch transformation interposers, and/or motherboard PCBs.

BACKGROUND

The data rates for high-speed serial interfaces (e.g., SerDes, PCIe, 224G Ethernet) are expected to continue to scale higher, resulting in the signals experiencing increased insertion loss when routed on a traditional package with standard buildup thicknesses. One alternative to increasing dielectric thickness to reduce signaling losses is to void metal layers directly above and/or below the signal routing layer in order to increase the effective dielectric thickness of the transmission line. This allows for the signal traces with a fixed impedance target to design to a wider trace width and trace spacings without modifying the package construction. This concept sometimes referred to as "skip-layer routing" enables a larger width and spacing at lower losses while still meeting the signals impedance target.

However, this skip-layer routing configuration results in an increase in the package layer count. A standard strip-line signal route configuration requires three metal layers, one signal layer with ground reference layers above and below. A skip-layer signal routing configuration requires two additional "skip" metal layers that sit between the signal and the reference grounds, totaling five metal layers. This increase in layer count increases the per unit package cost, negatively impacts fabrication capacity, reduces yield and can increase the package form factor. On top of the increased layer count implications, the metal voiding in the skip layers increase manufacturing risk due to large copper density variations they create within the layers.

EMBODIMENTS OF THE PRESENT DISCLOSURE

Figure 1A:
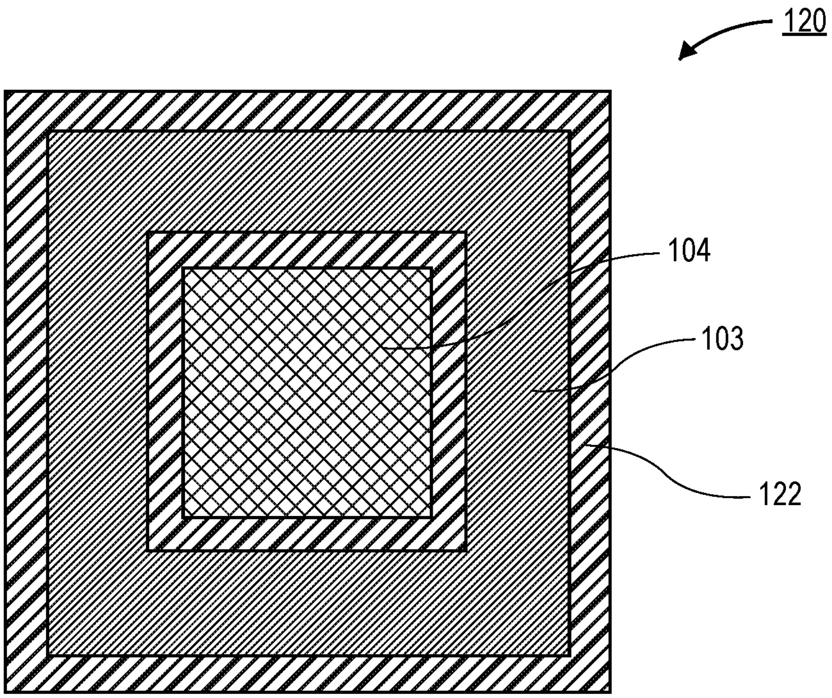
FIG. 1A is a plan view illustration of a portion of a core with an adhesion layer surrounding a signal routing region and a power region, in accordance with an embodiment.

Described herein are electronic devices with low loss routing and inductors for power delivery between glass cores in the package substrate, in accordance with various embodiments. Packages for the purposes of this disclosure can apply to electronic package substrates, space or pitch transformation interposers, and/or motherboard PCBs. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, high speed serial interfaces (e.g., serializer/deserializer (SerDes) signals) experience higher insertion loss when the nets are routed on the package with standard buildup thicknesses. However, instead of using skip layers to improve losses, embodiments disclosed herein route the SerDes signals through the core. In a particular embodiment, a multi-layer core is used, and the SerDes signals are routed between core layers. In some embodiments, the core layers comprise glass or buildup film and glass. Due to the thickness of the glass core layers (e.g., 100 μm or more) there is no need for skip layers, as the glass cores provide lower capacitance allowing for signal traces to have large trace widths and trace spacings. This enables low losses while meeting impedance targets. Without skip layers, the layer count of the package substrate is reduced. Additionally, manufacturing complexities due to copper density variation are avoided.

In addition to providing routing for SerDes applications, it is to be appreciated that other types of signal routing may be integrated into the multi-layer core as well. For example, cavities in the core layers may be filled with a ground plane in order to reduce the distance between the ground and the trace. As such, standard differential routing or single ended high-density routing (which both need ground planes closer to the traces) may be implemented in some embodiments.

In yet another embodiment, it is to be appreciated that power delivery architectures may also be included in the multi-layer core. In some instances, the thickness of the power delivery traces may be greater than the thickness of the signaling traces. This can be implemented by either forming recesses in the glass core layers, or by increasing the distance between two glass cores. In yet another embodiment, power delivery features may include inductors. For example, spiral inductors (e.g., in a single layer or multiple layers) may be provided between glass cores to provide inductance below the die. Some embodiments may also include magnetic material around the inductors to improve the performance of the inductors.

Referring now to FIG. 1A, a plan view illustration of a portion of a multi-layer core 120 is shown, in accordance with an embodiment. The illustrated view shows the core 120 with a top layer (e.g., a top glass layer) removed. The resulting image depicts a signal routing region 103 that surrounds a power delivery region 104. While shown in FIG. 1A and the following Figures as being different regions that are adjacent to each other, it is to be appreciated that the signal routing region 103 and the power delivery region 104 may not be as clearly defined as illustrated. For example, there may be some power delivery structures inside the signal region, especially when there are some die side components. Similarly, signal traces and power planes may coexist in the power delivery region 104, especially in regions near the die edge and where the IP blocks are located. That is to say, power delivery components and signaling components may both be located within a given region of the device. An interface material 122 may also be provided in the layer between glass layers. The interface material 122 may be an adhesive layer. The interface material 122 may adhere to the conductive features and the glass layers. In a particular embodiment, the interface material 122 may be a buildup film or the like.

In FIG. 1A, the signal routing region 103 and the power delivery region 104 are shown as uniform blocks. That is, the structure of individual traces and/or other conductive features in the signal routing region 103 and the power delivery region 104 are omitted for simplicity. Those skilled in the art will recognize that traces and the like may populate the regions 103 and 104, as will be described in greater detail below. Additionally, it is to be appreciated that the interface material 122 may surround the individual traces and other conductive features within the regions 103 and 104.

Figure 1B:
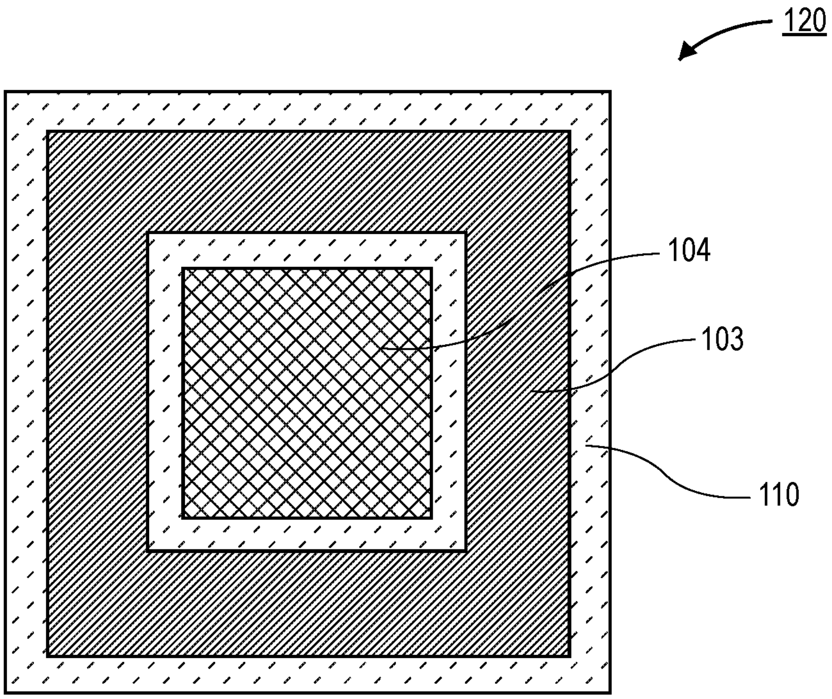
FIG. 1B is a plan view illustration of a portion of a core without the adhesion layer that shows the signal routing region and the power region over a glass layer, in accordance with an embodiment.

Referring now to FIG. 1B, a plan view illustration of the multi-layer core 120 is shown in accordance with an additional embodiment. The difference between FIGS. 1B and 1A is that in FIG. 1B the interface material 122 is omitted. As such, the underlying core layer 110 is visible. In an embodiment, the core layer 110 may be a glass core layer, which sometimes may be referred to as a glass layer 110 for short. In an embodiment, the glass layer 110 may be any type of glass suitable for electronic packaging architectures. In some embodiments, a thickness of the glass layer 110 may be approximately 100 μm or greater. Though it is to be appreciated that thinner glass layers 110 may also be used in some embodiments.

Figure 2A:
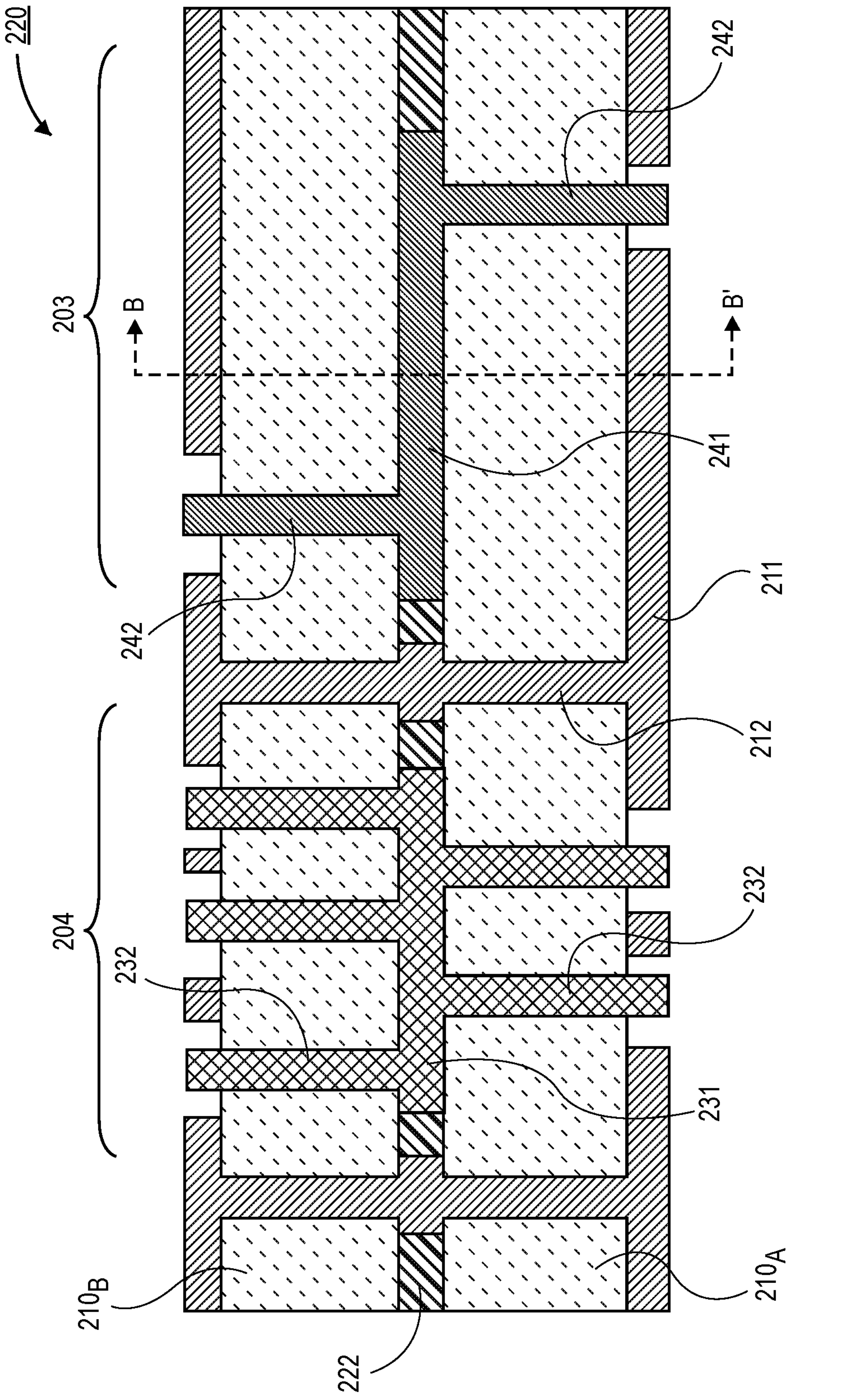
FIG. 2A is a cross-sectional illustration of a package core with a power region and a signal routing region with the lateral traces disposed between a pair of glass layers, in accordance with an embodiment.

Referring now to FIG. 2A, a cross-sectional illustration of a multi-layer core 220 is shown, in accordance with an embodiment. In FIG. 2A, it is to be appreciated that only the multi-layer core 220 is shown for simplicity. It is to be appreciated that additional routing can be provided above and/or below the multi-layer core 220 in standard buildup layers. In an embodiment, the multi-layer core 220 comprises a first glass layer $\mathbf{210}_A$ and a second glass layer $\mathbf{210}_B$. An interface layer 222 may be provided between the glass layers $\mathbf{210}_A$ and $\mathbf{210}_B$. The interface layer 222 may be an adhesive layer that bonds the first glass layer $\mathbf{210}_A$ to the second glass layer $\mathbf{210}_B$. In an embodiment, the interface layer 222 may have a thickness that is substantially equal to a thickness of the traces 241 and 231 provided between the glass layers 210. As used herein, substantially equal may refer to two values that are within 10% of each other. For example, 9 μm may be substantially equal to 10 μm in some embodiments. In a particular embodiment the thicknesses of the traces 241 and 231 may be approximately 30 μm or less or approximately 15 μm or less.

In an embodiment, the multi-layer core 220 may comprise a signal routing region 203 and a power delivery region 204. In an embodiment, trace 241 may be provided in the signal routing region 203. The trace 241 may be coupled to the top and bottom of the core 220 by vias 242. In a particular embodiment, the trace 241 may be a SerDes signal trace. Though, it is to be appreciated that other signal routing architectures may also be included in the signal routing region 203. That is, low loss signals may be able to provide communicative coupling between the front and backside of the multi-layer core 220. In an embodiment, trace 231 may be provided in the power delivery region 204. While referred to as a trace 231, it is to be appreciated that the trace 231 may also be a plane in some embodiments. The trace 231 may be coupled to the top and bottom surface of the core 220 by vias 232. In an embodiment, ground planes 211 may be provided above and/or below the core 220. Ground vias 212 may pass through the glass layers $\mathbf{210}_A$ and $\mathbf{210}_B$ and through the interface layer 222.

Figure 2B:
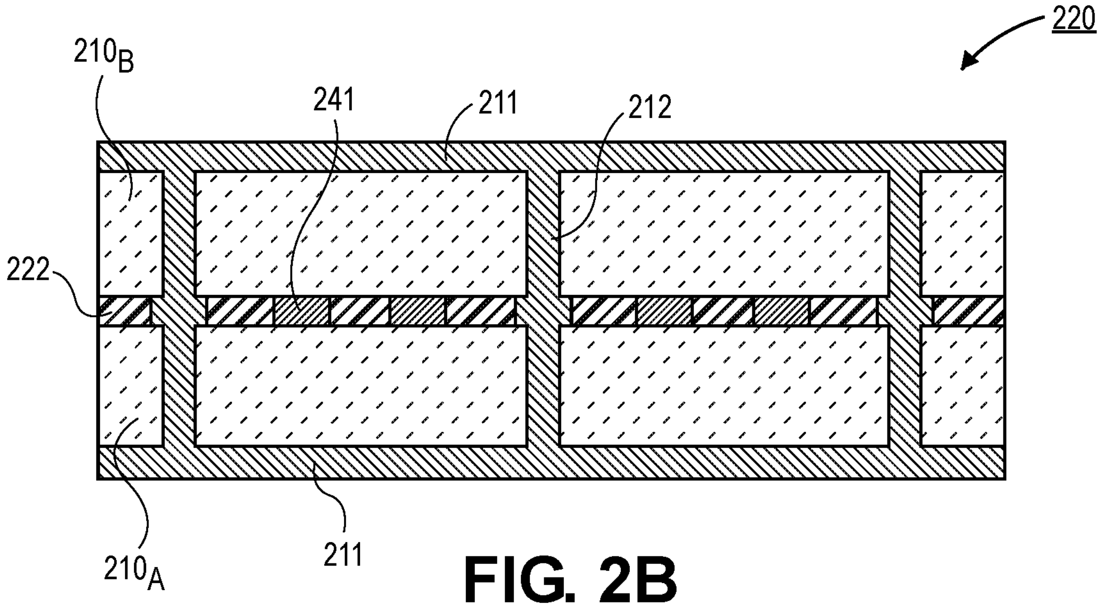
FIG. 2B is a cross-sectional illustration of the package core through the signal routing region, in accordance with an embodiment.

Referring now to FIG. 2B, a cross-sectional illustration of the multi-layer core 220 in FIG. 2A along line B-B' is shown, in accordance with an embodiment. In an embodiment, the cross-section is through the signal routing region 203. In an embodiment, traces 241 may extend into and out of the plane of FIG. 2B. Sidewalls of the traces 241 may be contacted by the interface layer 222. The top and bottom surfaces of the traces 241 may be contacted by the glass layers $\mathbf{210}_A$ and $\mathbf{210}_B$.

In an embodiment, the traces 241 may be arranged in pairs (e.g., to provide differential signaling). Each of the signaling pairs may be surrounded by ground planes 211 and ground vias 212. The distance between the ground planes 211 and the traces 241 may be set by the thicknesses of the glass layers $\mathbf{210}_A$ and $\mathbf{210}_B$. For example, the distance between the ground planes 211 and the traces 241 may be approximately 100 μm or greater. As such, ultra-low loss signaling traces can be provided in some embodiments. Particularly, the wide gap between the ground planes 211 and the traces 241 may allow for wider trace 241 widths and trace 241 spacings.

Figure 2C:
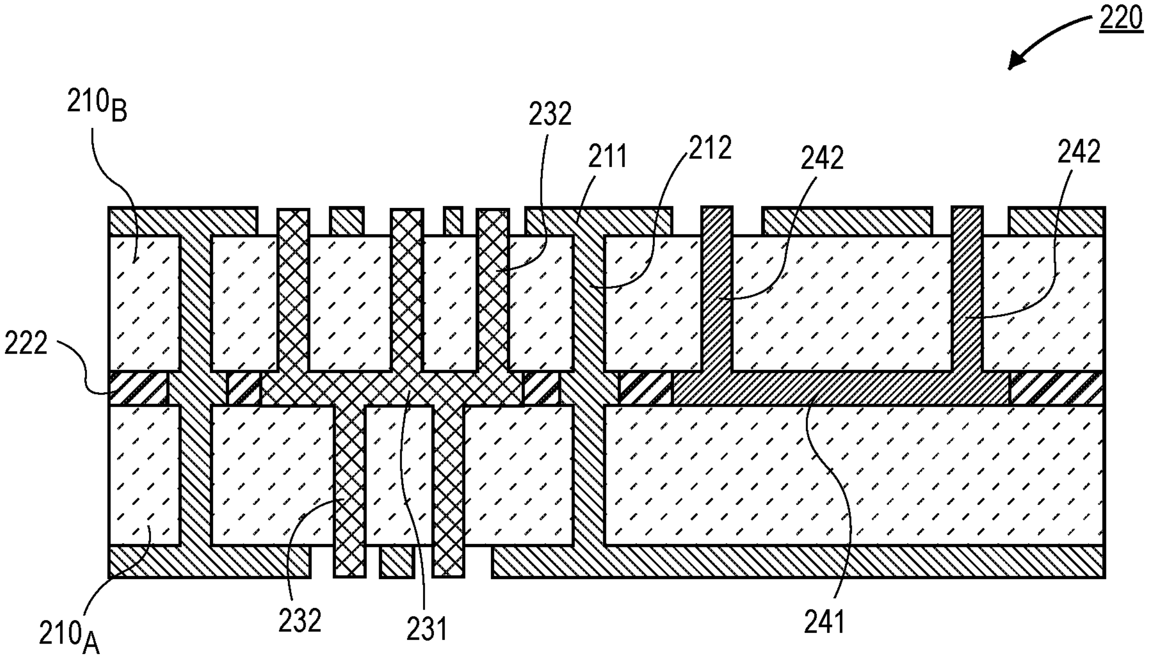
FIG. 2C is a cross-sectional illustration of a package core with a signal routing region that provides a conductive path between two die side components, in accordance with an embodiment.

Referring now to FIG. 2C, a cross-sectional illustration of a multi-layer core 220 is shown, in accordance with an additional embodiment. In an embodiment, the multi-layer core 220 may be similar to the multi-layer core 220 in FIG. 2A with the exception of the routing path in the signal routing region. Instead of providing a signal path from the top surface of the core 220 to a bottom surface of the core 220 (as is the case in FIG. 2A), the signal path provides routing between two locations on the top surface of the core 220. Such an embodiment may be useful when a signal is routed from a die to another die side component. That is, low loss signals may be able to provide communicative coupling between components on a single side of the package substrate. For example, the additional die side component may include a connector, an optical module, a die, a chiplet, or the like.

Figure 3A:
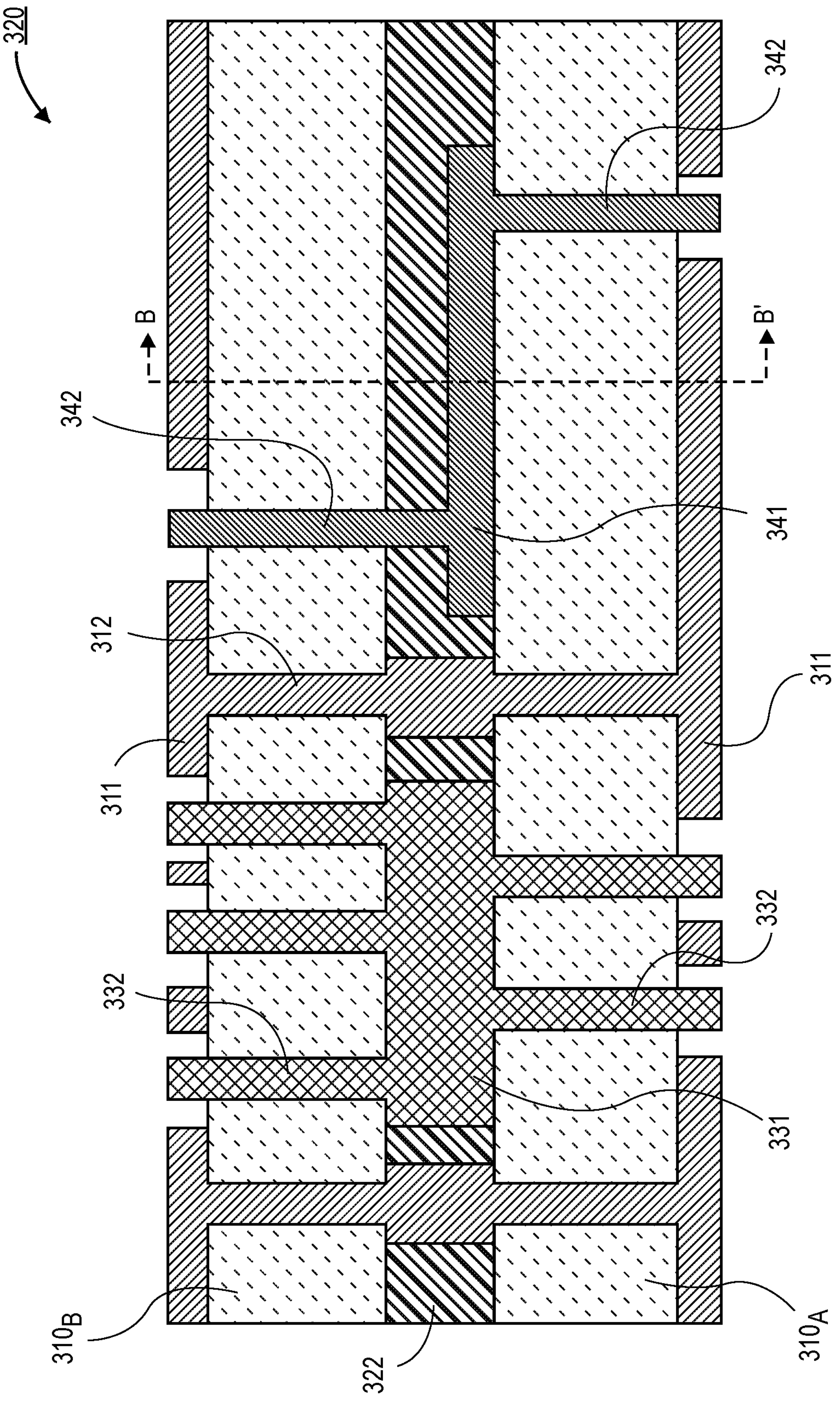
FIG. 3A is a cross-sectional illustration of a package core with a signal routing region and a power region, wherein the traces in the power region are thicker than the traces in the signal routing region, in accordance with an embodiment.

Referring now to FIG. 3A, a cross-sectional illustration of a multi-layer core 320 is shown, in accordance with another embodiment. In an embodiment, the core 320 may comprise a first glass layer $\mathbf{310}_A$ and a second glass layer $\mathbf{310}_B$. An interface layer 322 may be provided between the glass layers $\mathbf{310}_A$ and $\mathbf{310}_B$. In an embodiment, the interface layer 322 is thicker than the embodiments described in greater detail above. Due to the increase in thickness, the power delivery trace 331 may be increased in thickness. Increasing the thickness of the power delivery trace 331 may allow for lower resistance and improved power delivery performance. In an embodiment, the power delivery trace 331 may be coupled to the top and bottom surface of the core 320 by vias 332. Additionally, it is to be appreciated that the power delivery trace 331 may be a plane in some embodiments.

In an embodiment, the signal routing trace 341 may include vias 342 that connect the signal routing trace 341 to the top and bottom of the core 320. Additionally, it is to be appreciated that a thickness of the signal routing trace 341 may be smaller than the thickness of the power delivery trace 331. When the signal routing trace 341 is thinner than the interface layer 322, portions of the interface layer 322 may be provided over a top surface of the signal routing trace 341. Alternatively, the signal routing trace 341 may be contacting the glass layer $\mathbf{310}_B$, and a portion of the interface layer 322 may be between a bottom surface of the signal routing trace 341 and the glass layer $\mathbf{310}_A$.

The core 320 may also comprise ground planes 311 and ground vias 312. Similar to embodiments described above, the glass layers $\mathbf{310}_A$ and $\mathbf{310}_B$ provide relatively large separations between the ground planes 311 and the signal routing trace 341 in order to enable low loss architectures.

Figure 3B:
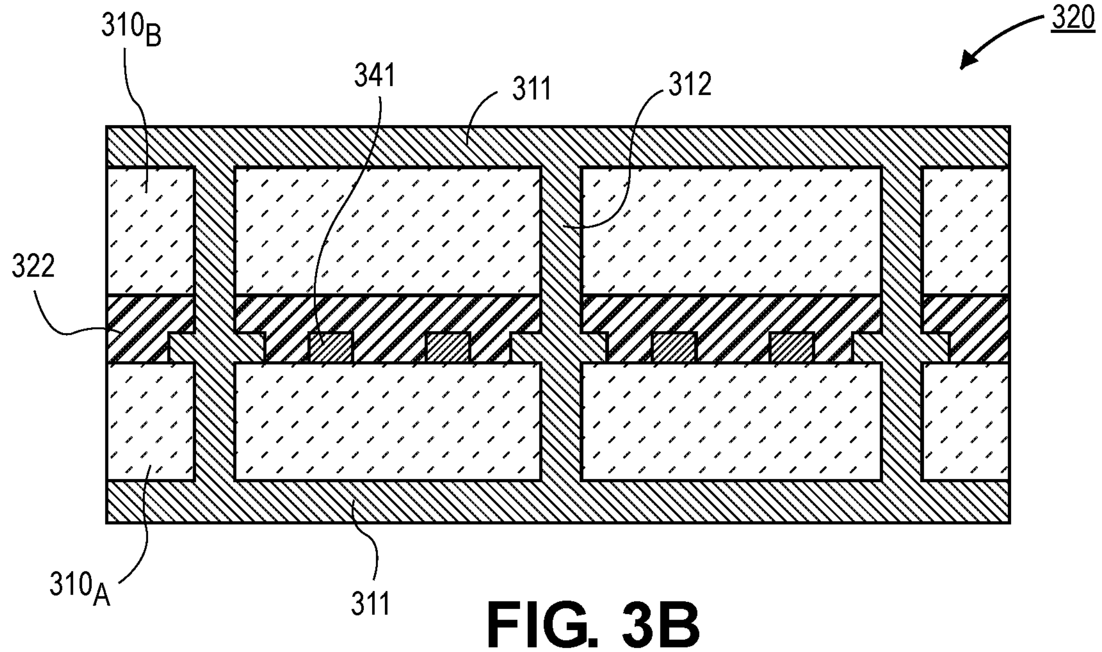
FIG. 3B is a cross-sectional illustration of the package core through the signal routing region, in accordance with an embodiment.

Referring now to FIG. 3B, a cross-sectional illustration of the multi-layer core 320 in FIG. 3A along line B-B' is shown, in accordance with an embodiment. In an embodiment, the cross-section is through the signal routing region. In an embodiment, signal routing traces 341 may extend into and out of the plane of FIG. 3B. Sidewalls of the signal routing traces 341 may be contacted by the interface layer 322. Additionally, the top surface of the signal routing traces 341 may be contacted by the interface layer 322. The bottom surface of the signal routing traces 341 may be in contact with the bottom glass layer $\mathbf{310}_A$.

In an embodiment, the signal routing traces 341 may be arranged in pairs (e.g., to provide differential signaling). Each of the signaling pairs may be surrounded by ground planes 311 and ground vias 312. The distance between the ground planes 311 and the signal routing traces 341 may be set by the thicknesses of the glass layers $\mathbf{310}_A$ and $\mathbf{310}_B$ and a thickness of the interface layer 322. For example, the distance between the ground planes 311 and the signal routing traces 341 may be approximately 100 μm or greater. As such, ultra-low loss signaling traces can be provided in some embodiments. Particularly, the wide gap between the ground planes 311 and the signal routing traces 341 may allow for wider trace 341 widths and signal routing trace 341 spacings.

Figure 3C:
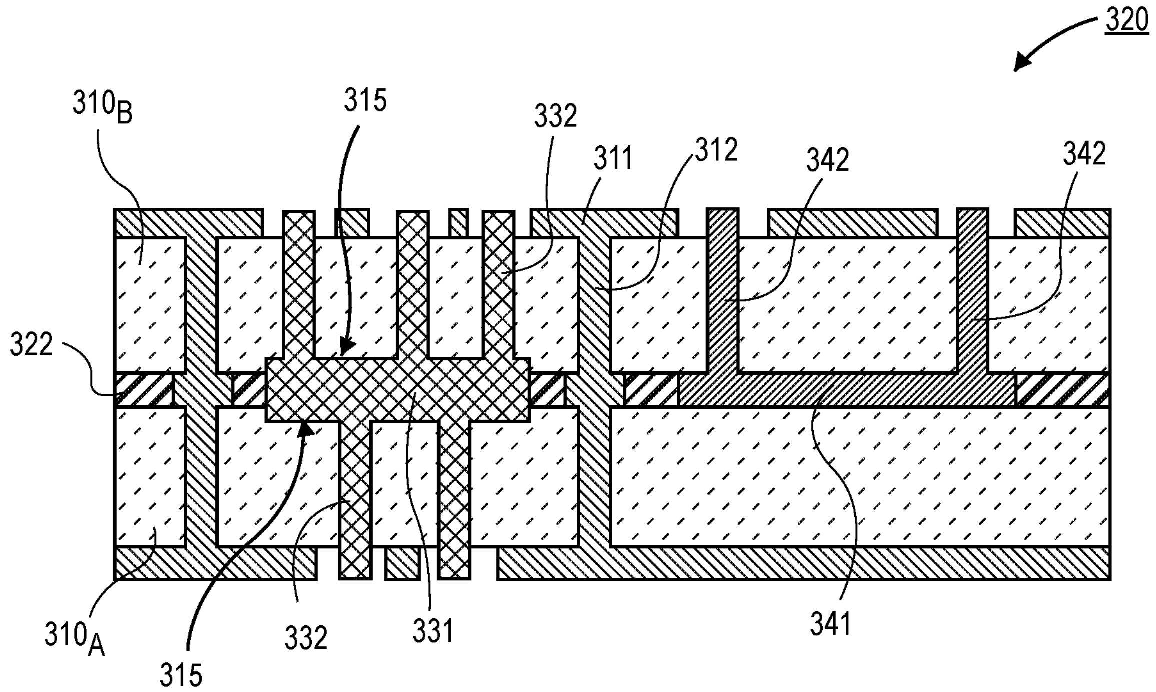
FIG. 3C is a cross-sectional illustration of a package core with a power region with a trace or plane that fills cavities in the glass cores, in accordance with an embodiment.

Referring now to FIG. 3C, a cross-sectional illustration of a multi-layer core 320 is shown, in accordance with yet another embodiment. As shown, the signal routing trace 341 couples together vias 342 that reach to the top surface of the core 320. In other embodiments, the vias 342 may provide routing between the top surface and the bottom surface of the core 320, similar to the embodiment shown in FIG. 3A.

FIG. 3C differs from the embodiment shown in FIG. 3A, in that the interface layer 322 is reduced in thickness. For example, the thickness of the interface layer 322 may be substantially equal to the thickness of the signal routing trace 341. However, the power delivery trace 331 may still have a thickness that is greater than the signal routing trace 341. The extra thickness of the power delivery trace 331 may be accommodated by cavities 315 into the glass layers $\mathbf{310}_A$ and $\mathbf{310}_B$. As illustrated, portions of the sidewalls of the power delivery trace 331 may be in direct contact with the glass layers $\mathbf{310}_A$ and $\mathbf{310}_B$ in addition to contacting the interface layer 322. In the illustrated embodiment, cavities 315 are provided above and below the power delivery trace 331. However, in other embodiments, a cavity 315 may be provided only above or below the power delivery trace 331. Furthermore, while referred to as a power delivery trace 331, it is to be appreciated that power delivery trace 331 may optionally be a plane. The cavities 315 may be blind cavities 315. That is, the cavities 315 do not pass entirely through a thickness of the glass layers $\mathbf{310}_A$ and $\mathbf{310}_B$. Unless stated otherwise, cavities disclosed herein are blind cavities. In an embodiment, the blind cavities may be filled with metal. In certain instances, the blind cavities are formed in the glass layer.

Figure 4A:
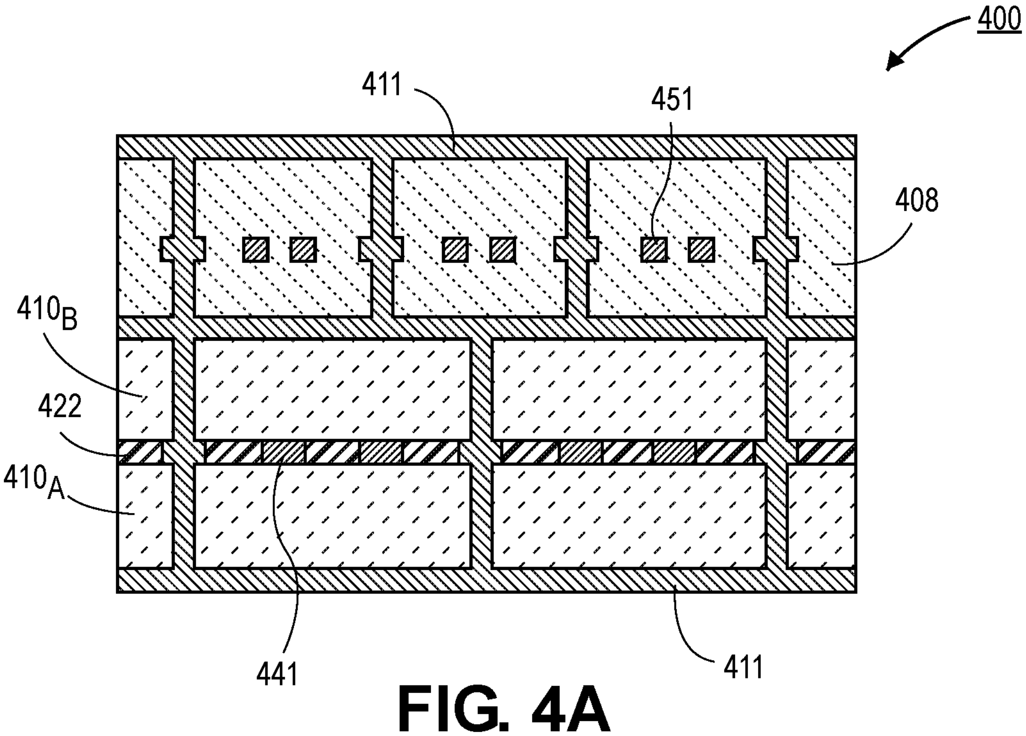
FIG. 4A is a cross-sectional illustration of an electronic package with a multi-layer glass core with routing layers over the glass core, in accordance with an embodiment.

Referring now to FIG. 4A, a cross-sectional illustration of an electronic package 400 is shown, in accordance with an embodiment. In the illustrated embodiment, the buildup layers are only shown above the top surface of the core for simplicity. However, it is to be appreciated that similar buildup layers would be present on the bottom side of the core as well. The bottom side of the core may have more or fewer buildup layers than on the top side, and/or there may not be any routing on the bottom side of the core. Additionally, it is to be appreciated that more buildup layers can be provided over the top surface of the core. Since no skip layers are needed, each of the traces 451 may be spaced away from the ground planes 411 by a single buildup layer 408 similar to standard stripline routing.

In an embodiment, the electronic package 400 in FIG. 4A illustrates the reduction in layer count possible by using embodiments disclosed herein. For example, the low loss layer is provided within the core instead of in the buildup layers. If the low loss layers were provided in the buildup layers, skip layer routing would be necessary. This would require an additional three routing layers. That is, four additional layers would be added above the core, and the traces 441 would be eliminated, leaving a total of three extra routing layers. Instead, a bottom glass layer $\mathbf{410}_A$ and a top glass layer $\mathbf{410}_B$ provide the needed distance between the traces 441 and the ground planes 411. An interface layer 422 may secure the top glass layer $\mathbf{410}_B$ to the bottom glass layer $\mathbf{410}_A$. In this manner, a two routing layer embodiment can be implemented with seven layers (including the top and bottom layers).

Figure 4B:
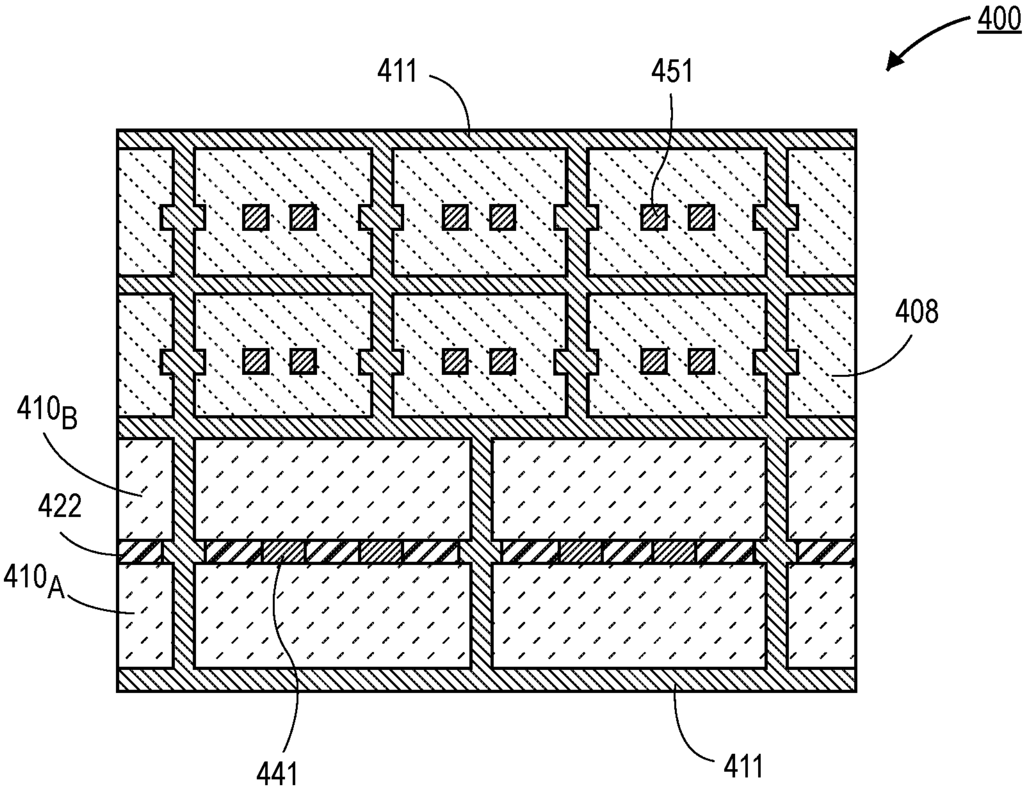
FIG. 4B is a cross-sectional illustration of an electronic package with a multi-layer glass core with a plurality of routing layers over the glass core, in accordance with an embodiment.

In a case where additional routing layers are needed, additional buildup layers 408 and standard routing can be added. For example, in FIG. 4B three routing layers are shown. Two standard routing layers with traces 451 are provided in the buildup layers 408. Ultra-low loss traces 441 are provided between the top glass layer $\mathbf{410}_B$ and the bottom glass layer $\mathbf{410}_A$. In such an embodiment, the entire electronic package can be implemented in eleven layers. Without the use of embodiments shown here, a similar electronic package would require fourteen layers. Additionally, if two standard loss routing layers and one ultra-low loss layer is needed, then embodiments disclosed herein would still only need eleven layers, while conventional packaging would require eighteen layers. As such, the number of layers is lower and the cost and complexity of fabricating the electronic package is reduced.

Figure 5A:
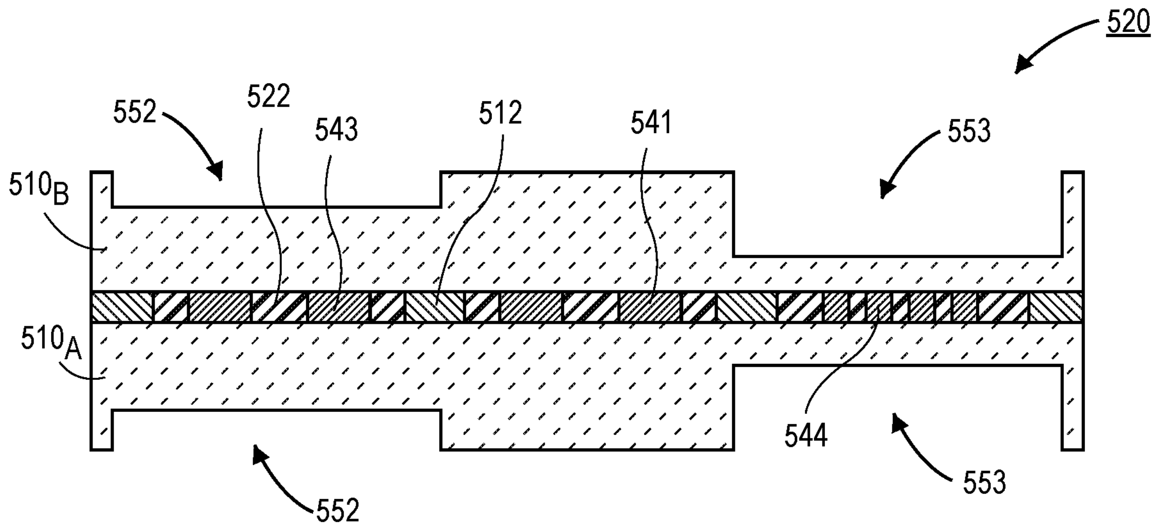
FIG. 5A is a cross-sectional illustration of a package core with recesses with cavities formed into the glass layers, in accordance with an embodiment.

Referring now to FIG. 5A, a cross-sectional illustration of a multi-layer core 520 is shown, in accordance with an additional embodiment. In addition to providing routing for ultra-low loss signals, embodiments may include incorporating other routing architectures into the multi-layer core 520. For example, standard differential routing and single ended high-density routing may also be included in the multi-layer core 520. In order to accommodate the different routing architectures, the ground planes may be moved closer to the traces. For example, the ground planes may be brought closer to the traces by incorporating cavities into the glass layers 510 when the cavities are filled with metal.

As shown in FIG. 5A, a first glass layer $\mathbf{510}_A$ and a second glass layer $\mathbf{510}_B$ may be bonded to each other by an interface layer 522. Traces 541 and 544 may be provided between the glass layers $\mathbf{510}_A$ and $\mathbf{510}_B$. In an embodiment, the leftmost set of traces 543 may be for the standard differential routing, the center pair of traces 541 may be for the ultra-low loss routing, and the right set of traces 544 may be for the single ended high-density routing. While the trace width and spacing between traces 541 and 543 look similar, it is to be appreciated that in some instances, the ultra-low loss traces 541 may have larger trace widths and spacings than the standard differential routing traces 543. The standard differential routing may be provided between cavities 552 that are formed into the glass layers $\mathbf{510}_A$ and $\mathbf{510}_B$. The single ended high-density routing traces 544 may be provided between cavities 553 in the glass layers $\mathbf{510}_A$ and $\mathbf{510}_B$. The cavities 553 may be deeper than the cavities 552. As such, the ground plane will be closer to the single ended high-density routing traces 544 than the ultra-low loss traces 541.

Figure 5B:
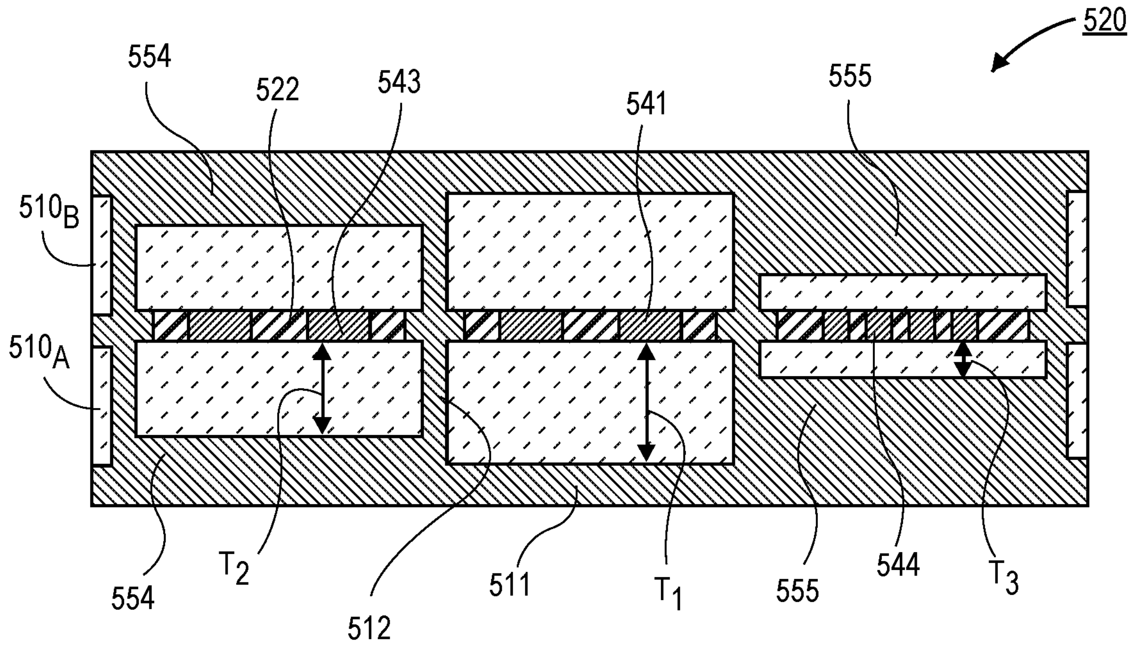
FIG. 5B is a cross-sectional illustration of the package core in FIG. 5A after conductive planes fill the cavities, in accordance with an embodiment.

Referring now to FIG. 5B, a cross-sectional illustration of the multi-layer core 520 after the ground planes 511 and ground vias 512 are formed is shown, in accordance with an embodiment. As shown, conductive blocks 554 fill the cavities 552, and conductive blocks 555 fill the cavities 553. The conductive blocks 554 and 555 may be connected to each other by the ground planes 511. As such, the conductive blocks 554 and 555 are also held at the ground potential. The conductive blocks 554 and 555 reduce the distance between the traces 543 and 544 and the nearest ground reference. As shown, the ultra-low loss traces 541 in the middle may be separated from the ground planes 511 by a first thickness $T_1$. In the illustrated embodiment, the thickness between the top of the ultra-low loss traces 541 and the ground planes 511 is also substantially equal to the first thickness $T_1$. However, it is to be appreciated that the thickness between the top of ultra-low loss traces 541 and the ground plane 511 may be equal to, less than, or greater than the first thickness $T_1$. The differential routing traces 543 may be separated from the ground planes 511 by a second thickness $T_2$ that is smaller than the first thickness $T_1$. Furthermore, it is to be appreciated that the thickness between the top of traces 543 and the ground plane 511 may be equal to, less than, or greater than the second thickness $T_2$. Additionally, the single ended high-density routing traces 544 may be separated from the ground planes 511 by a third thickness $T_3$ that is smaller than the second thickness $T_2$. In the illustrated embodiment, the thickness between the top of the single ended high-density routing traces 544 and the ground planes 511 is also substantially equal to the third thickness $T_3$. However, it is to be appreciated that the thickness between the top of single ended high-density routing traces 544 and the ground planes 511 may be equal to, less than, or greater than the third thickness $T_3$. As such, a plurality of different routing architectures may be provided within a single multi-layer core, in accordance with various embodiments disclosed herein.

Referring now to FIGS. 6A-7C, illustrations depicting architectures used in the power delivery region are shown, in accordance with various embodiments. As shown in the following Figures, inductor architectures may be included within a multi-layer core. In one embodiment, the inductors are planar spirals. In yet another embodiment, a pair of planar inductors are stacked over each other to provide more inductance. In some embodiments, magnetic materials may be provided around the inductors.

Figures 6A, 6B:
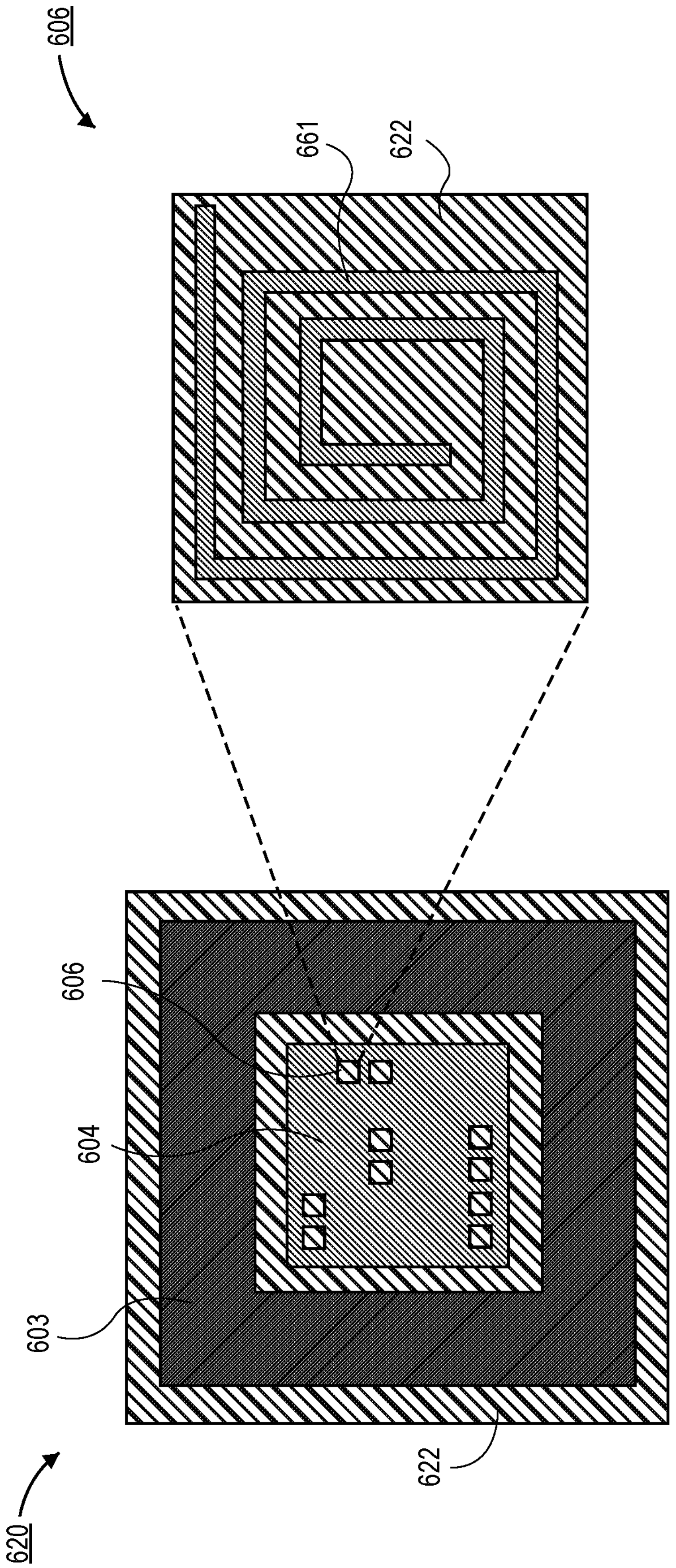
FIG. 6A is a plan view illustration of a core with a signal routing region and a power region, in accordance with an embodiment.
FIG. 6B is a plan view illustration of a portion of the power region with a planar inductor, in accordance with an embodiment.

Referring now to FIG. 6A, a plan view illustration of a multi-layer core 620 is shown, in accordance with an embodiment. In an embodiment, the multi-layer core 620 illustrates a middle layer where the routing is located. A signal routing region 603 may surround a power region 604. The power region 604 may be located below a die (not shown). In the illustrated embodiment, an interface layer 622 may surround the signal routing region 603 and the power region 604. While shown as solid blocks, it is to be appreciated that the power region 604 and the signal routing region 603 may comprise a plurality of traces and other structures. Interface material from the interface layer 622 may directly contact the traces and structures within the signal routing region 603 and the power region 604.

In an embodiment, the power region 604 may comprise a plurality of inductor blocks 606. The inductor blocks 606 may each comprise a planar inductor that is formed between the glass layers of the multi-layer core. The inductors may include planar inductors with any suitable architecture. For example, in FIG. 6B, a zoomed in illustration of one of the inductor blocks 606 is shown, in accordance with an embodiment. As shown, the inductor block 606 may include a spiral inductor 661. The spiral inductor 661 may have any number of loops to provide a desired level of inductance.

Figure 6C:
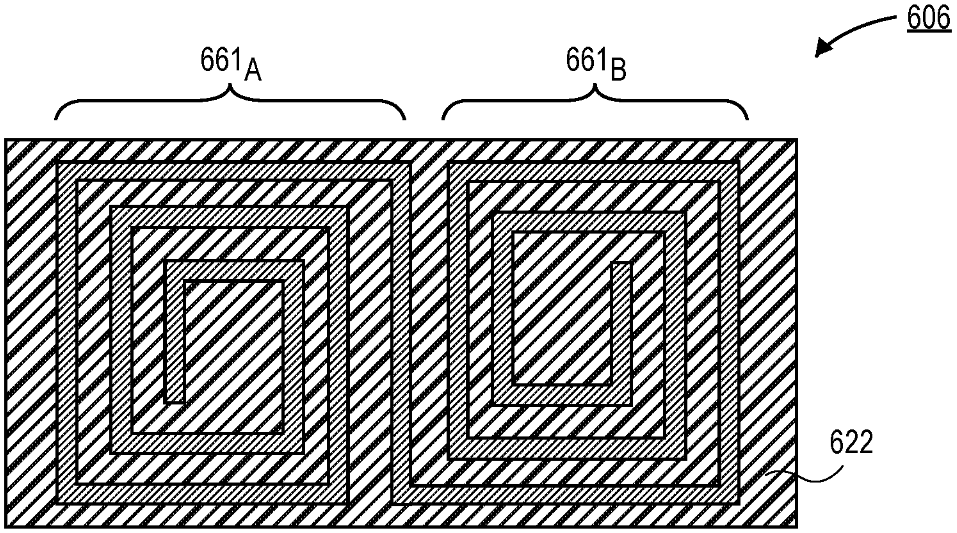
FIG. 6C is a plan view illustration of a portion of the power region with a planar inductor with two coils in series, in accordance with an embodiment.

Referring now to FIG. 6C, a plan view illustration of an inductor block 606 is shown, in accordance with an additional embodiment. As shown, the inductor block 606 may include a plurality of spiral inductors 661. For example, a first spiral inductor $\mathbf{661}_A$ may be coupled to a second spiral inductor $\mathbf{661}_B$. The two spiral inductors $\mathbf{661}_A$ and $\mathbf{661}_B$ may be connected to each other in series electrically. While two inductors 661 are shown, it is to be appreciated that any number of inductors 661 may be connected to each other in order to provide a desired inductance. In an embodiment, the inductors 661 may be over an underlying glass layer and surrounded by the interface layer 622.

Figure 6D:
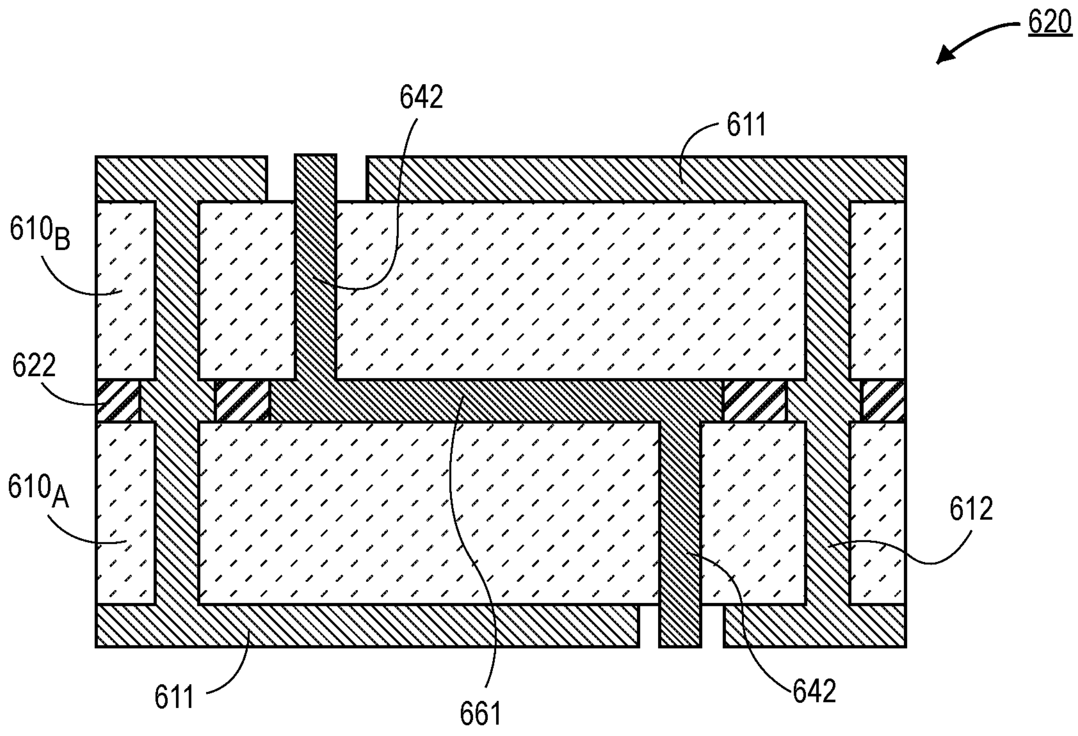
FIG. 6D is a cross-sectional illustration of a multi-layer glass core with an inductor provided between the glass layers, in accordance with an embodiment.

Referring now to FIG. 6D, a cross-sectional illustration of the multi-layer core 620 is shown, in accordance with an embodiment. As shown, a pair of glass layers $\mathbf{610}_A$ and $\mathbf{610}_B$ may be bonded together by an interface layer 622. Ground planes 611 may be provided on a top surface and a bottom surface of the core 620, and ground vias 612 may pass through the glass layers $\mathbf{610}_A$ and $\mathbf{610}_B$. In an embodiment, an inductor 661 may be provided between the glass layers $\mathbf{610}_A$ and $\mathbf{610}_B$. The interface layer 622 may also surround the inductor 661. The inductor 661 may be a planar spiral inductor. For example, the inductor 661 may be similar to the inductors 661 described in greater detail above with respect to FIGS. 6B and 6C. The inductor 661 may be coupled to the top surface of the core 620 and the bottom surface of the core 620 by vias 642. In other embodiments, the inductor 661 may be coupled to the top side of the core 620 by a pair of vias 642 that both pass through the glass layer $\mathbf{610}_B$.

Figure 6E:
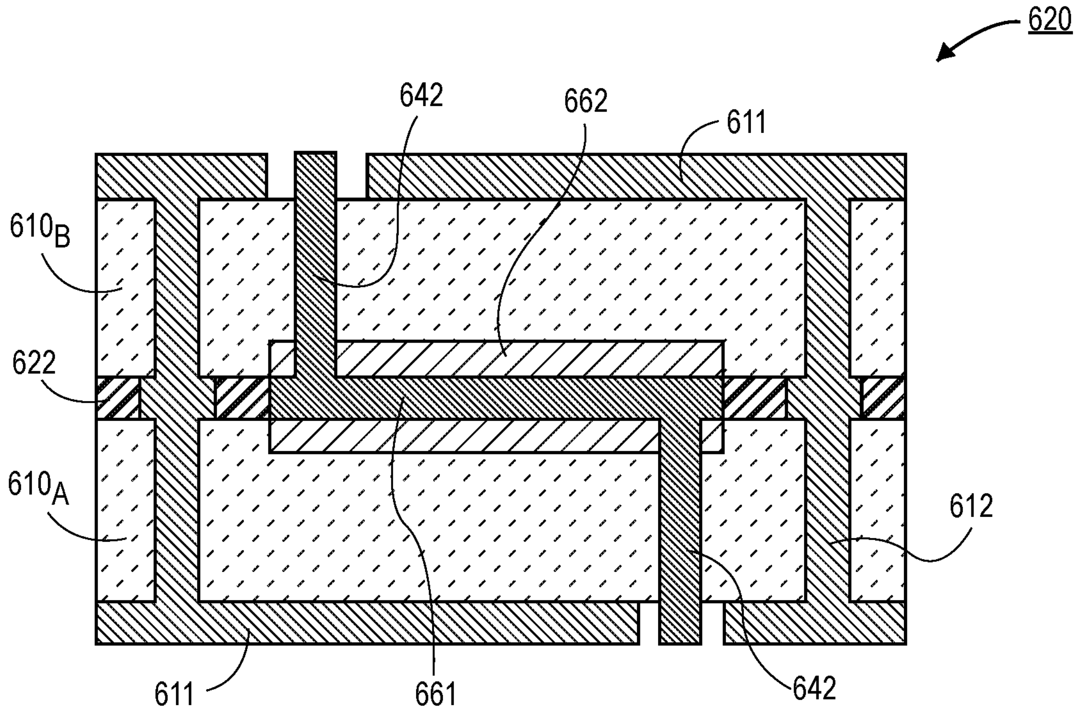
FIG. 6E is a cross-sectional illustration of a multi-layer glass core with an inductor surrounded by a magnetic material, in accordance with an embodiment.

Referring now to FIG. 6E, a cross-sectional illustration of a multi-layer core 620 is shown, in accordance with an additional embodiment. The core 620 may be substantially similar to the core 620 described above with respect to FIG. 6D, with the exception of a magnetic layer 662 being added. Adding magnetic material around the inductor 661 increases the performance of the inductor and helps reduce noise from the inductor 661. As such, smaller inductor 661 footprints and/or fewer inductors 661 may be needed for a given architecture.

In an embodiment, the magnetic layer 662 may be provided above and below the inductor 661. The magnetic layer 662 may extend into the top glass layer $\mathbf{610}_B$ and into the bottom glass layer $\mathbf{610}_A$. In other embodiments, the interface layer 622 may be thicker than the inductor 661, and the magnetic layers 662 may be entirely within the interface layer 622. In an embodiment, a magnetic layer 662 may be provided over only a top surface of the inductor 661 or only under a bottom surface of the inductor 661.

Figure 7A:
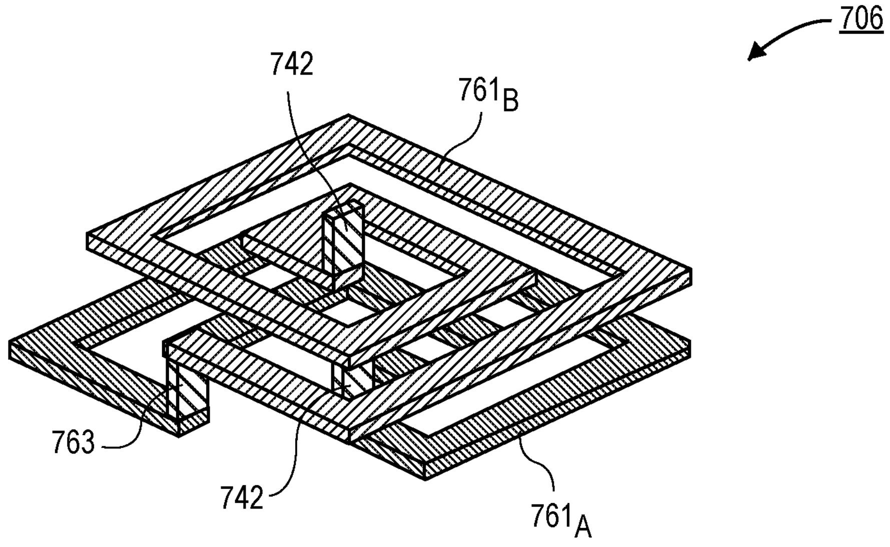
FIG. 7A is a perspective view illustration of an inductor with two planar inductors that are stacked and electrically connected in series, in accordance with an embodiment.

Referring now to FIG. 7A, a perspective view illustration of a multi-layer inductor 706 is shown, in accordance with an embodiment. The inductor 706 shown in FIG. 7A is illustrated without the surrounding materials, such as the glass layers and the interface layer. However, it is to be appreciated that the inductor 706 may be provided between the glass layers and surrounded by the interface layer. For example, a first inductor $\mathbf{761}_A$ may be provided in contact with a bottom glass layer, and a second inductor $\mathbf{761}_B$ may be provided in contact with a top glass layer. Vias 742 may pass through the glass layers, and the via 763 may connect the first inductor $\mathbf{761}_A$ to the second inductor $\mathbf{761}_B$. In the illustrated embodiment, the first inductor $\mathbf{761}_A$ and the second inductor $\mathbf{761}_B$ are connected in series electrically.

However in other embodiments, the first inductor 761$_A$ and the second inductor 761$_B$ may be connected in parallel electrically.

Figure 7B:
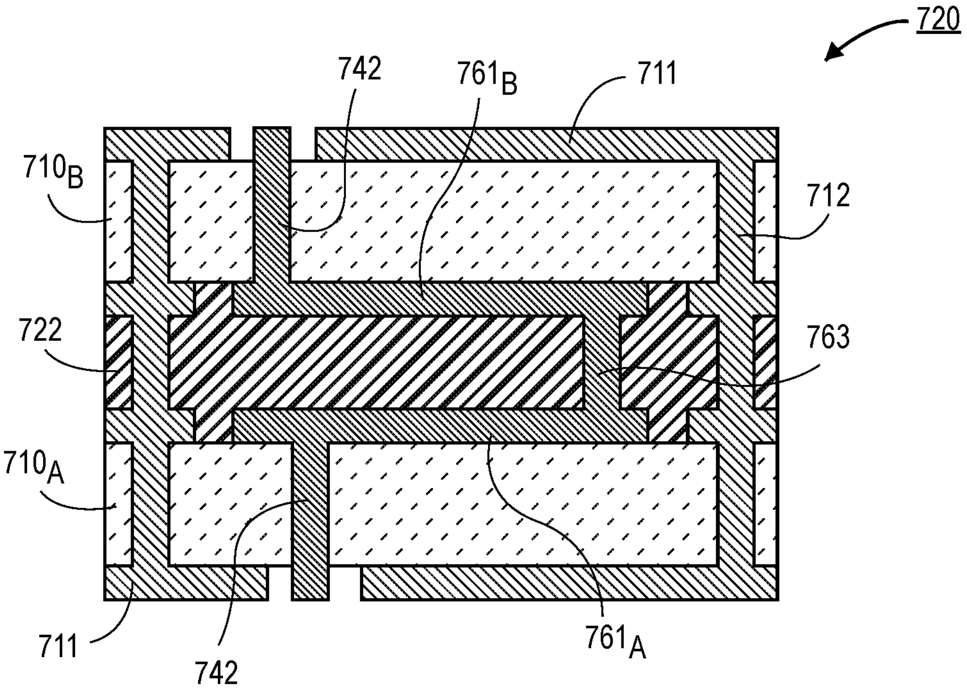
FIG. 7B is a cross-sectional illustration of a multi-layer glass core with a two-layer inductor between the glass layers, in accordance with an embodiment.

Referring now to FIG. 7B, a cross-sectional illustration of a multi-layer core 720 is shown, in accordance with an embodiment. As shown, the core 720 comprises a first glass layer 710$_A$ and a second glass layer 710$_B$. Ground planes 711 may be provided over the top and bottom surfaces of the core 720, and ground vias 712 may pass through the thickness of the core 720. In an embodiment, an interface layer 722 is provided between the first glass layer 710$_A$ and the second glass layer 710$_B$. The interface layer 722 may have a thickness that is greater than the thickness of individual inductors 761. For example, a first inductor 761$_A$ may be provided over the first glass layer 710$_A$, and a second inductor 761$_B$ may be provided under the second glass layer 710$_B$. A portion of the interface layer 722 may separate the first inductor 761$_A$ from the second inductor 761$_B$.

In an embodiment, the first inductor 761$_A$ may be coupled to a bottom of the core 720 by a via 742, and the second inductor 761$_B$ may be coupled to a top of the core 720 by a via 742. The first inductor 761$_A$ may be coupled to the second inductor 761$_B$ by a via 763 that passes through the interface layer 722. In such an architecture, the interface layer 722 may surround portions of the inductors 761$_A$ and 761$_B$, and make direct contact with the inductors 761$_A$ and 761$_B$.

Figure 7C:
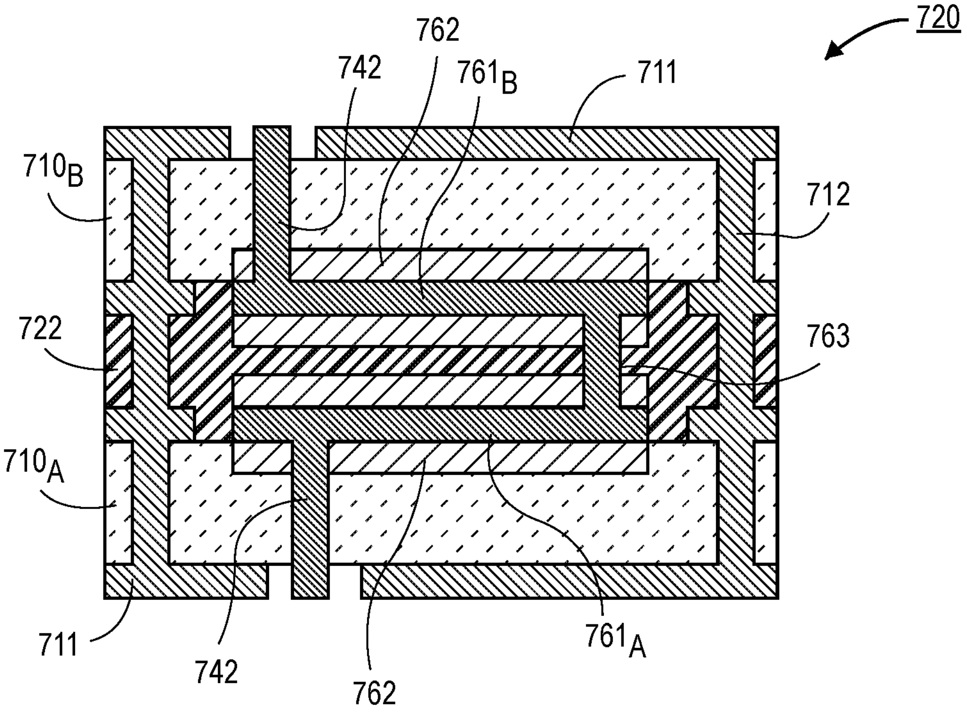
FIG. 7C is a cross-sectional illustration of a multi-layer glass core with a two layer inductor that is surrounded by a magnetic material, in accordance with an embodiment.

Referring now to FIG. 7C, a cross-sectional illustration of a core 720 is shown, in accordance with yet another embodiment. In an embodiment, the core 720 in FIG. 7C may be substantially similar to the core 720 in FIG. 7B, with the exception of the inclusion of magnetic layers 762. In an embodiment, the magnetic layers 762 may surround the inductors 761$_A$ and 761$_B$. As such, the inductors 761$_A$ and 761$_B$ may be separated from the interface layer 722 in some embodiments. In an embodiment, the magnetic layers 762 may be separated from each other with a portion of the interface layer 722 between the top magnetic layers 762 and the bottom magnetic layers 762. In other embodiments, a single block of magnetic material may surround both the first inductor 761$_A$ and the second inductor 761$_B$.

As illustrated, the magnetic material 762 may extend into the glass layers 710$_A$ and 710$_B$. For example, cavities may be formed into the glass layers 710 in order to accommodate the magnetic material 762. In other embodiments, the magnetic material 762 may only be provided within a thickness of the interface layer 722. In such embodiments, the top surface of the inductor 761$_B$ may directly contact the glass layer 710$_B$, and the bottom surface of the inductor 761$_A$ may directly contact the glass layer 710$_A$. Similar to some embodiments above, the inductors 761$_A$ and 761$_B$ may be made thicker by providing cavities in the glass and filling them with the metal. Additionally, it is to be appreciated that additional inductors 761 may be provided in the Z-direction if there are additional glass core layers provided. Such an embodiment may increase inductance without having to occupy additional in-plane real estate.

While planar inductors are shown in FIGS. 7A-7C, it is to be appreciated that embodiments may also include non-planar or vertically oriented inductors. Examples of such embodiments are shown in FIGS. 7D and 7E.

Figure 7D:
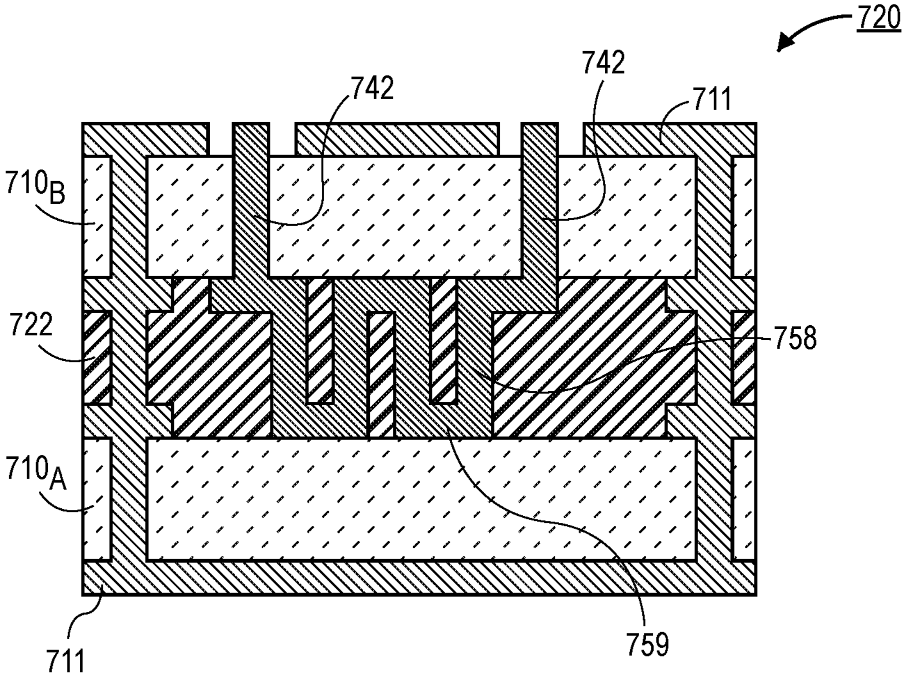
FIG. 7D is a cross-sectional illustration of a multi-layer glass core with a non-planar inductor between the glass layers, in accordance with an embodiment.

Referring now to FIG. 7D, a cross-sectional illustration of a core 720 is shown, in accordance with an embodiment. The core 720 may comprise a first glass layer 710$_A$ that is coupled to a second glass layer 710$_B$ by an interface layer 722. In an embodiment, vias 742 couple the top side of the core to an inductor. In an embodiment, the inductor is a vertically oriented (non-planar) inductor. The inductor comprises two or more vertical vias 758 that are coupled together by lateral traces 759. In the illustrated embodiment, both ends of the inductor are coupled to the top surface of the core 720. However, it is to be appreciated that one of the ends of the inductor may be coupled to a backside of the core 720.

Figure 7E:
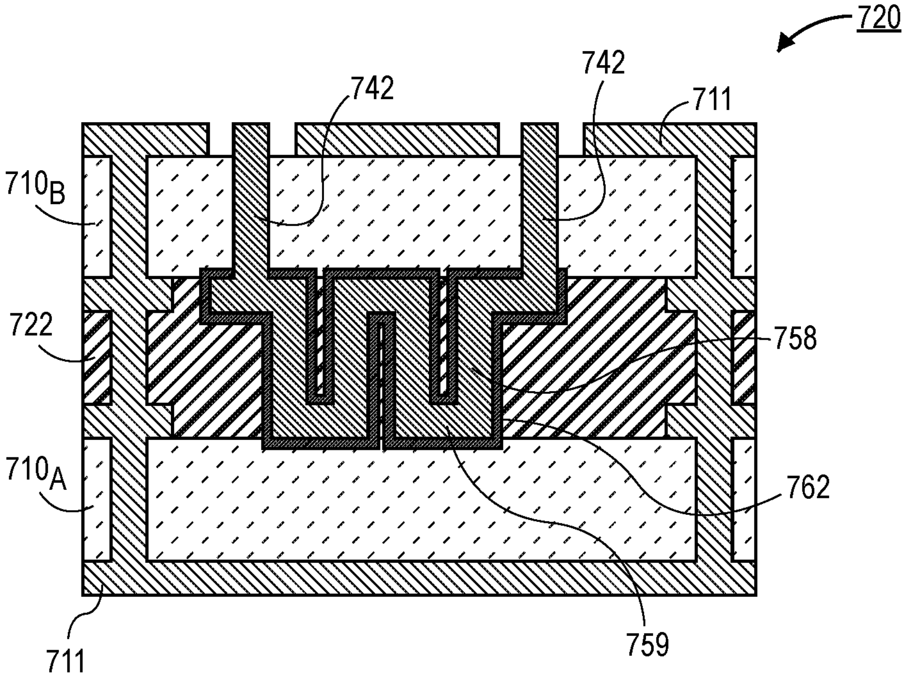
FIG. 7E is a cross-sectional illustration of a multi-layer glass core with a non-planar inductor with a magnetic layer surrounding the vias, in accordance with an embodiment.

Referring now to FIG. 7E, a cross-sectional illustration of a core 720 is shown, in accordance with an additional embodiment. In an embodiment, the core 720 in FIG. 7E may be substantially similar to the core 720 in FIG. 7D, with the exception of there being magnetic material 762 surrounding the inductor. In the illustrated embodiment, magnetic material 762 may surround the traces 759 and the vias 758. However, embodiments may also include the magnetic material 762 only around the traces 759 or only around the vias 758.

In FIGS. 7D and 7E, the traces 759 are shown as being entirely within the interface layer 722. However, it is to be appreciated that the traces 759 may be partially or entirely within the first glass layer 710$_A$ and/or the second glass layer 710$_B$. Additionally, the interface layer 722 may be an adhesive or another glass layer.

Referring now to FIGS. 8A-8E, a series of cross-sectional illustrations depicting multi-layer cores 820 are shown, in accordance with additional embodiments. Instead of being limited to a pair of glass layers 810, the cores 820 may have a plurality of glass layers 810. For example, there may be three glass layers 810$_A$, 810$_B$, and 810$_C$. The addition of a third glass layer 810 may allow for an additional routing layer to be provided within the cores 820.

Figure 8A:
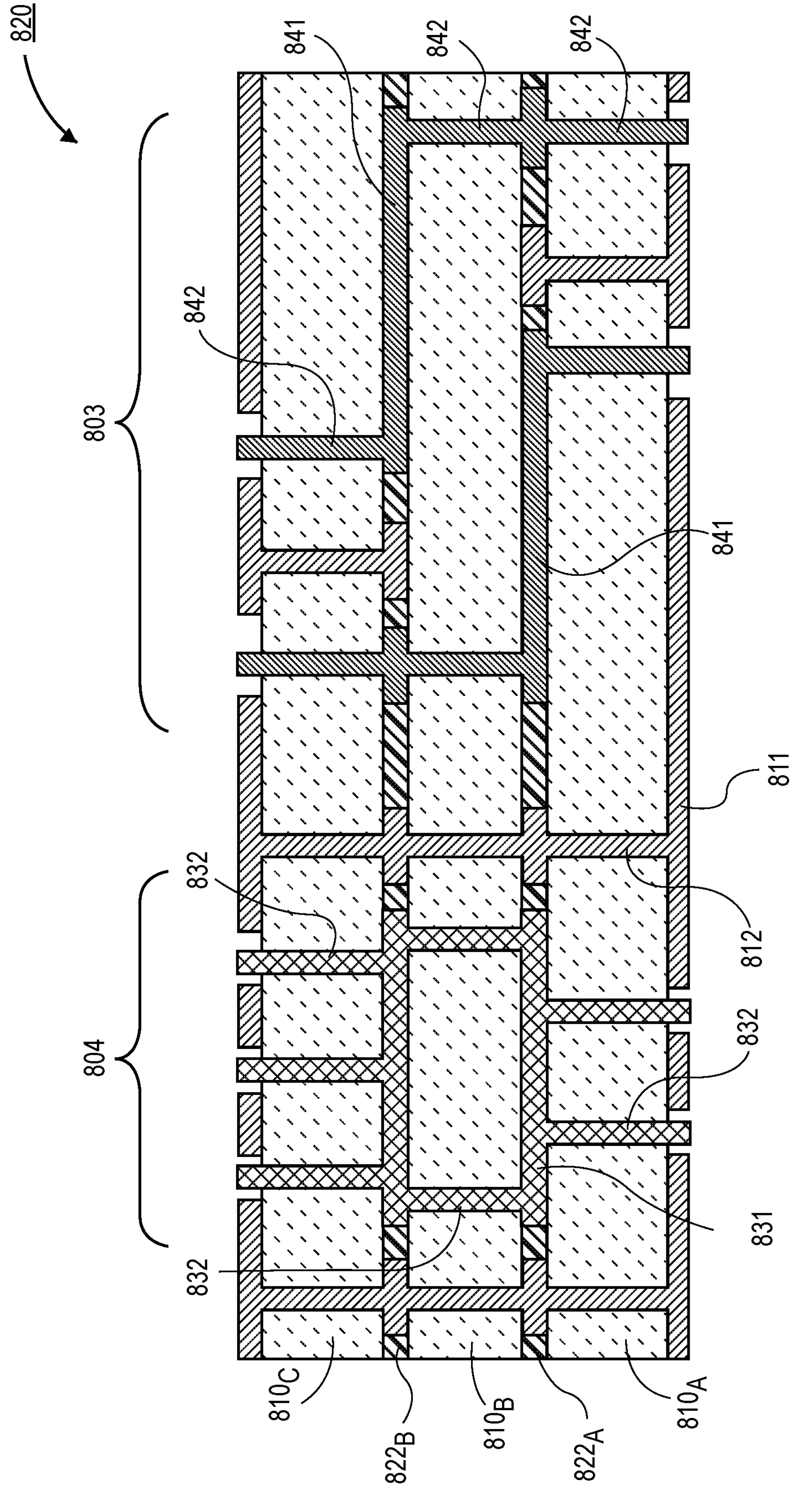
FIG. 8A is a cross-sectional illustration of a multi-layer glass core with a power region and a signal routing region, in accordance with an embodiment.

Referring now to FIG. 8A, a cross-sectional illustration of a multi-layer core 820 is shown, in accordance with an embodiment. In an embodiment, the core 820 may comprise a first glass layer 810$_A$, a second glass layer 810$_B$, and a third glass layer 810$_C$. The glass layers 810 may be adhered to each other by interface layers 822. For example, a first interface layer 822$_A$ couples the first glass layer 810$_A$ to the second glass layer 810$_B$, and a second interface layer 822$_B$ couples the second glass layer 810$_B$ to the third glass layer 810$_C$. The glass layers 810 may be any suitable glass material. In an embodiment, a thickness of the glass layers 810 may be approximately 100 μm or greater. In an embodiment, the interface layers 822 may be a buildup film or any other dielectric material that has adhesive properties.

In an embodiment, the core 820 may comprise a signal routing region 803 and a power delivery region 804. In the signal routing region 803, low loss signal routing may be provided along traces 841. In an embodiment, the traces 841 may be provided in the interface layers 822. For example, a first trace 841 is provided in the first interface layer 822$_A$, and a second trace 841 is provided in the second interface layer 822$_B$. The top and bottom surfaces of the traces 841 may contact glass layers 810, and the sidewall surfaces of the traces 841 may contact the material of the interface layers 822. In an embodiment, vias 842 may provide connections between the traces 841 and the top and bottom of the core 820.

In an embodiment, power delivery traces 831 may be provided in the power delivery region 804. The power delivery traces 831 may also be provided in the interface layers 822$_A$ and 822$_B$. Vias 832 may connect the power delivery traces 831 to the top and bottom surfaces of the core 820. In an embodiment, the power delivery traces 831 may have thicknesses that are substantially equal to the thickness of the signal routing traces 841.

In an embodiment, ground planes 811 may be provided above and below the core 820. Ground vias 812 may pass through a thickness of the core 820. For example, ground vias 812 may pass through glass layers 810 and the interface layers 822. Due to the thickness of the glass layers 810, the ground planes 811 are separated from the traces 841 a distance suitable for low loss operation. For example, traces 841 may be considered ultra-low loss signaling traces 841. In some embodiments, the traces 841 may be SerDes signaling traces.

Figure 8B:
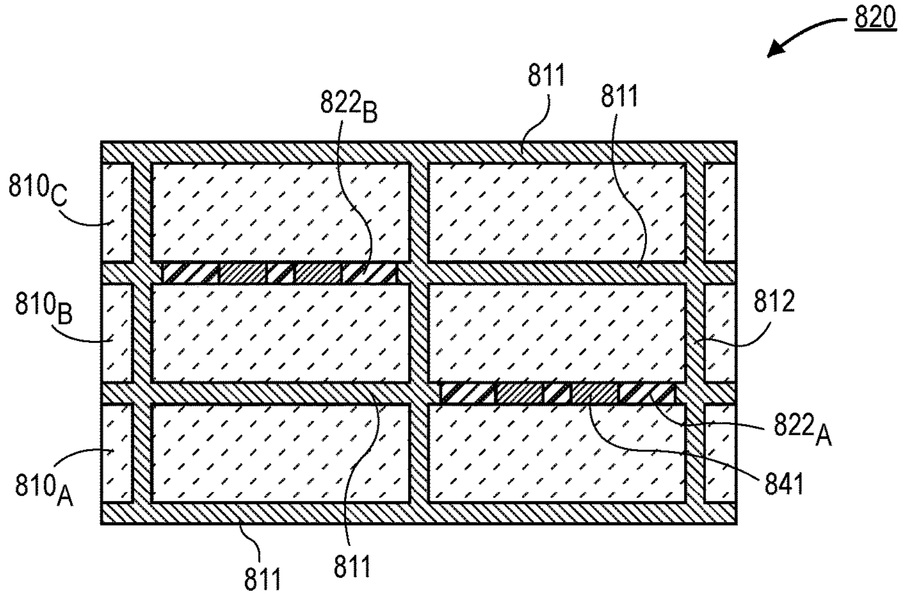
FIG. 8B is a cross-sectional illustration of the multi-layer glass core through the signal routing region, in accordance with an embodiment.

Referring now to FIG. 8B, a cross-sectional illustration of the core 820 through the signal routing region 803 is shown, in accordance with an embodiment. In the illustrated view, the signal traces 841 extend into and out of the plane of FIG. 8B. Each of the traces 841 may be provided in the interface layers $\mathbf{822}_A$ or $\mathbf{822}_B$. As shown, each of the traces 841 are separated from a ground plane 811 by the thickness of the glass layers $\mathbf{810}_A$, $\mathbf{810}_B$, and $\mathbf{810}_C$. In some embodiments, the glass layers 810 may be approximately 100 μm thick or greater. As such, there is a low capacitance between the traces 841 and the ground planes 811. This allows for ultra-low loss operation of the traces 841. As illustrated, the top and bottom surfaces of the traces 841 may be in direct contact with the glass layers 810. Sidewalls of the traces 841 may be in direct contact with the interface layers $\mathbf{822}_A$ or $\mathbf{822}_B$. That is, the thickness of the traces 841 may be substantially equal to a thickness of the interface layers 822.

Figure 8C:
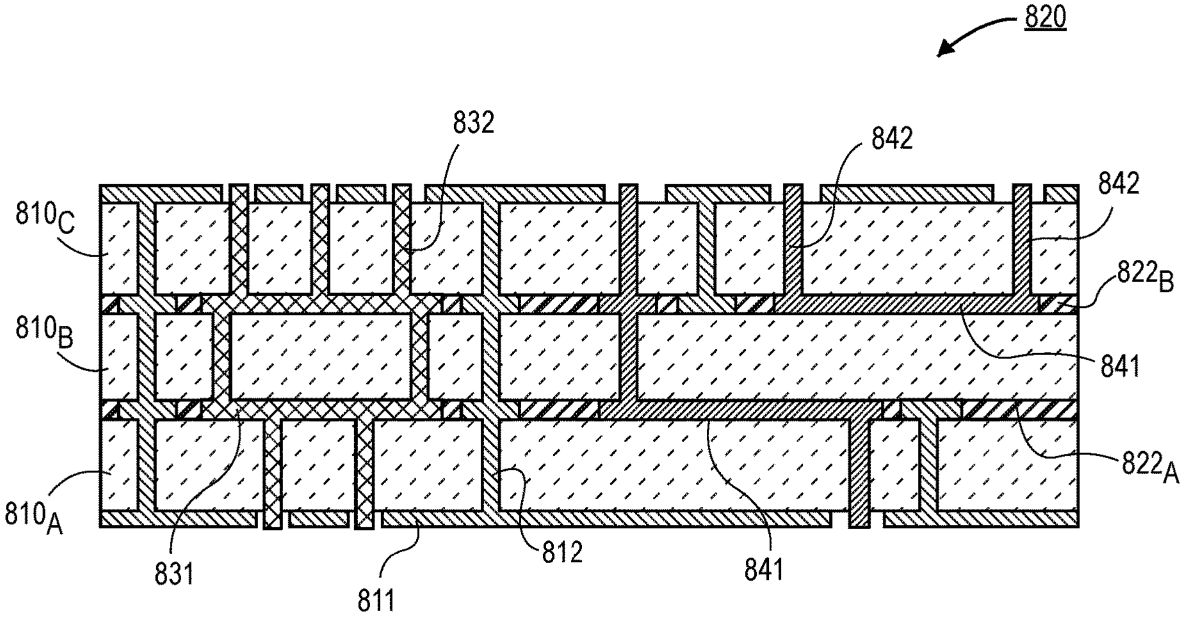
FIG. 8C is a cross-sectional illustration of a multi-layer glass core with a signal routing region that includes an electrical path between two die side components, in accordance with an embodiment.

Referring now to FIG. 8C, a cross-sectional illustration of a multi-layer core 820 is shown, in accordance with an additional embodiment. The core 820 in FIG. 8C may be substantially similar to the core 820 in FIG. 8A, with the exception of the routing in the signal routing region. In FIG. 8A, the traces 841 are both connected to the top and bottom surfaces of the core 820. In contrast, in FIG. 8C, a first trace 841 is coupled to the top and bottom surfaces of the core 820, and a second trace 841 is coupled between two locations on the top surface of the core 820.

Such an embodiment may be beneficial when a die (not shown) needs to be coupled to an additional die side component. For example, the die side component may include, but is not limited to, a connector, an optical module, another die or chiplet, or the like. In the illustrated embodiment, the first trace 841 is provided in the first interface layer $\mathbf{822}_A$ and the second trace 841 is provided in the second interface layer $\mathbf{822}_B$. However, it is to be appreciated that the two traces 841 may be implemented in the same interface layer 822 in some embodiments. Additionally, it is to be appreciated that the first trace 841 that connects the top of the multi-layer core 820 to the bottom of the multi-layer core 820 can be implemented in the second interface layer $\mathbf{822}_B$, and/or the second trace 841 connecting two locations on the top side of the multi-layer core 820 may be implemented in the first interface layer $\mathbf{822}_A$.

Figure 8D:
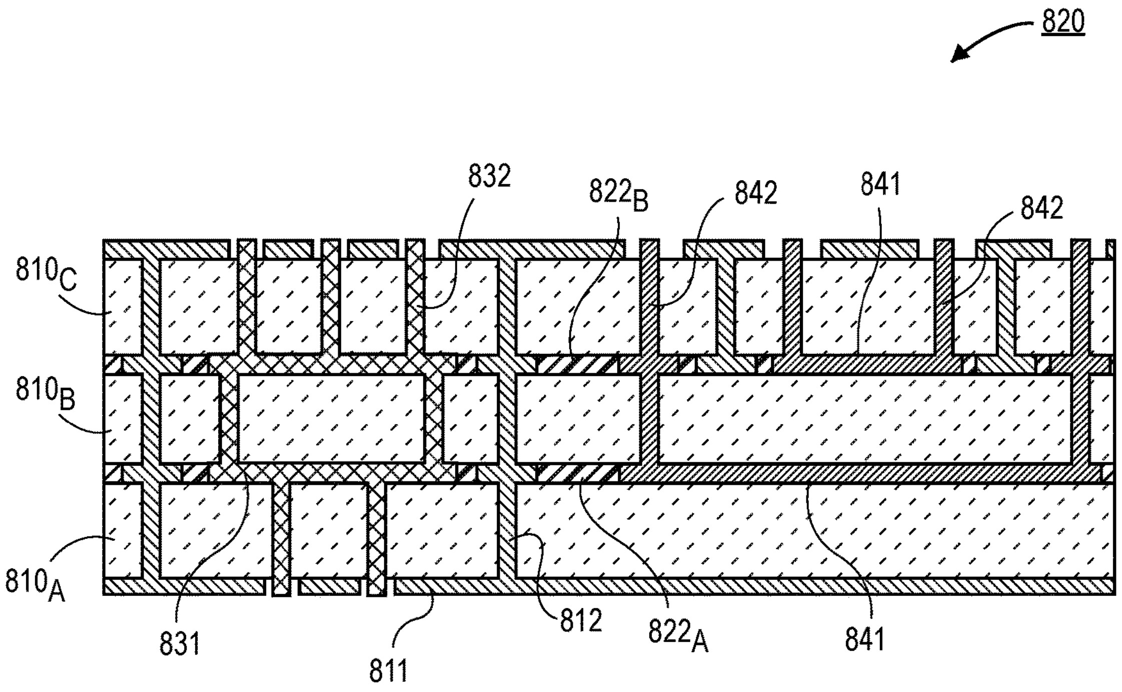
FIG. 8D is a cross-sectional illustration of a multi-layer glass core with a signal routing region that includes a pair of electric paths that connect die side components, in accordance with an embodiment.

Referring now to FIG. 8D, a cross-sectional illustration of a multi-layer core 820 is shown, in accordance with yet another embodiment. The core 820 in FIG. 8D may be substantially similar to the core 820 in FIG. 8C, with the exception of the routing of the trace 841 in the first interface layer $\mathbf{822}_A$. Instead of being connected to the top surface and the bottom surface of the core 820, the trace 841 is coupled between two locations on the top surface of the core 820. For example, vias 842 at each end of the trace 841 extend from the trace 841 to the top surface of the core 820. Such an embodiment may allow for a die to connect to another die side component, such as a connector, an optical module, or the like.

Figure 8E:
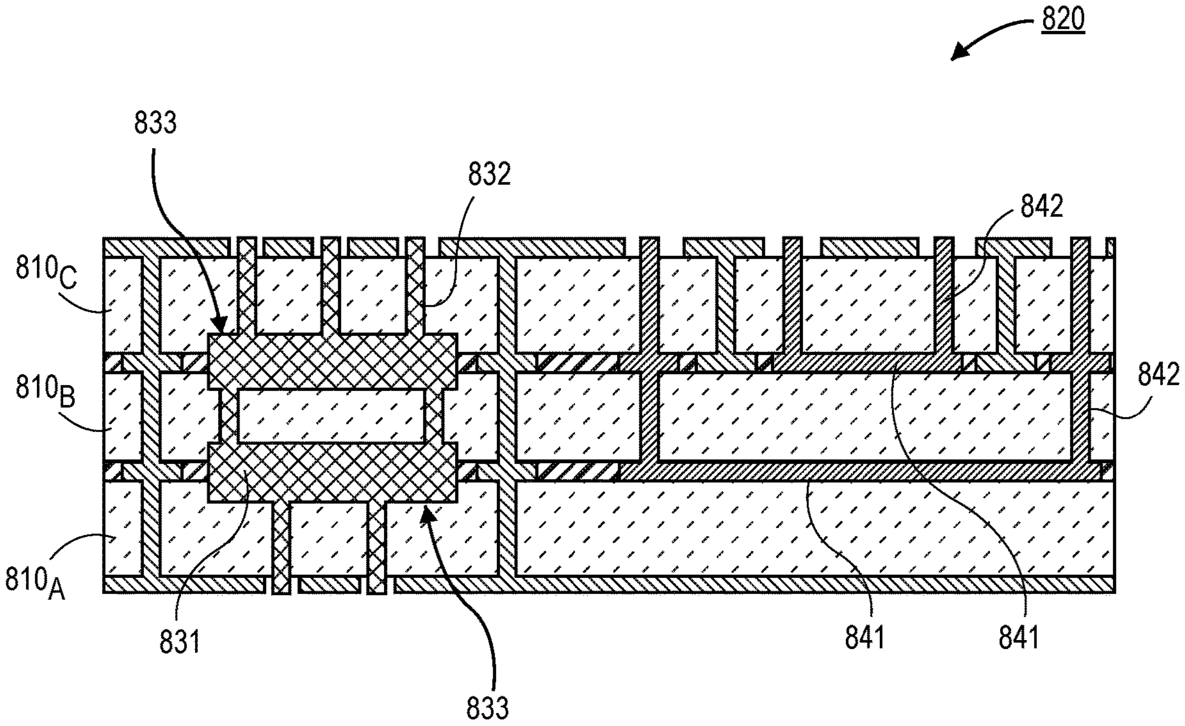
FIG. 8E is a cross-sectional illustration of a multi-layer glass core with a power region that includes traces or planes that are thicker than the traces in the signal routing region, in accordance with an embodiment.

Referring now to FIG. 8E, a cross-sectional illustration of a multi-layer core 820 is shown, in accordance with another embodiment. The core 820 in FIG. 8E may be substantially similar to the core 820 in FIG. 8D, with the exception of the architecture of the power delivery traces 831 in the power delivery region. Instead of having a thickness that is substantially equal to the thicknesses of the traces 841, the power delivery traces 831 have thicknesses that are greater than the thicknesses of the traces 841. Increasing the thickness of the power delivery traces 831 reduces resistance along the path and improves power delivery performance. Furthermore, it is to be appreciated that the power delivery traces 831 may also be planes in some embodiments.

In order to accommodate the larger thickness of the traces 831, cavities 833 may be formed into the glass layers 810 and filled with metal. In the illustrated embodiment, cavities 833 are formed into the top surface of the first glass layer $\mathbf{810}_A$, top and bottom surfaces of the second glass layer $\mathbf{810}_B$, and the bottom surface of the third glass layer $\mathbf{810}_C$. In other embodiments, the cavities 833 may be formed in only the first glass layer $\mathbf{810}_A$ and the third glass layer $\mathbf{810}_C$. Generally, a cavity 833 may be formed in one or more of the top surface of the first glass layer $\mathbf{810}_A$, the bottom surface of the second glass layer $\mathbf{810}_B$, the top surface of the second glass layer $\mathbf{810}_B$, and the bottom surface of the third glass layer $\mathbf{810}_C$.

Referring now to FIGS. 9A-9D, a series of cross-sectional illustrations of multi-layer cores 920 are shown, in accordance with additional embodiments. As shown, cavities may be formed into the glass layers 910 in order to modulate the distance between traces 941 and the ground planes 911. As such, different types of signaling architectures may be provided in the multi-layer cores 920 in addition to the ultra-low loss signaling traces (e.g., for use with SerDes signaling).

Figure 9A:
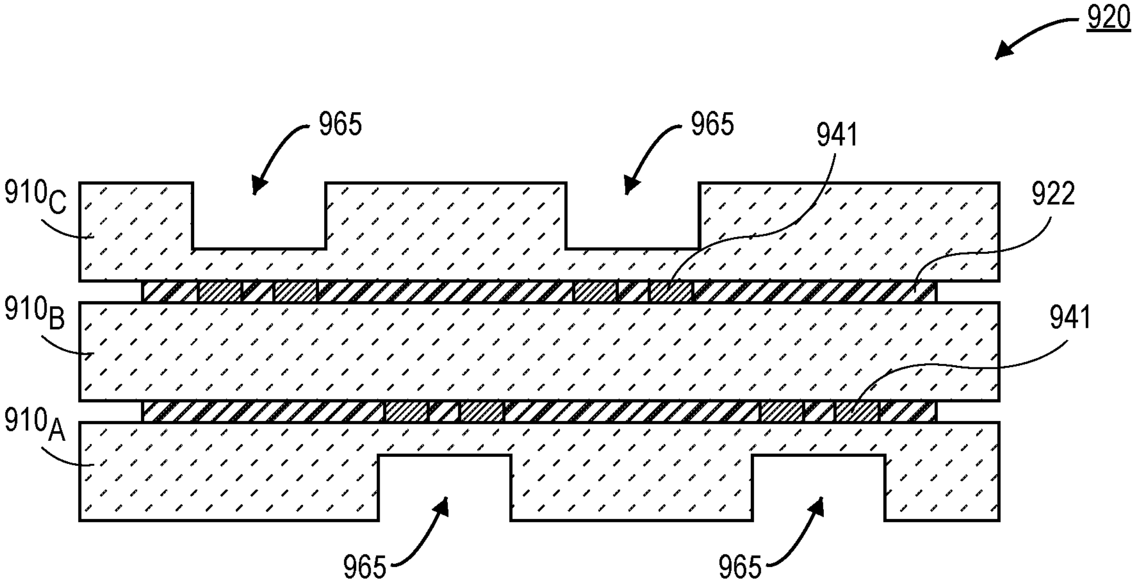
FIG. 9A is a cross-sectional illustration of a multi-layer glass core with a series of cavities formed into the glass layers over the traces, in accordance with an embodiment.

Referring now to FIG. 9A, a cross-sectional illustration of a multi-layer core 920 is shown, in accordance with an embodiment. In an embodiment, the core 920 comprises a first glass layer $\mathbf{910}_A$, a second glass layer $\mathbf{910}_B$, and a third glass layer $\mathbf{910}_C$. In an embodiment, the glass layers 910 are secured together by interface layers 922. In an embodiment, traces 941 may be provided in the interface layers 922. That is, the top and bottom surface of the traces 941 may contact the glass layers 910 and the sidewalls of the traces 941 may contact the interface layers 922. In an embodiment, the traces 941 may be paired together in order to enable dual stripline routing. However, dual stripline routing does not need a large distance between the traces 941 and the ground plane.

Accordingly, cavities 965 may be formed into the glass layers 910. The cavities 965 may be blind cavities 965. That is, the cavities 965 do not pass entirely through a thickness of the glass layer 910. In an embodiment, the cavities 965 are formed into the first glass layer $\mathbf{910}_A$ and the third glass layer $\mathbf{910}_C$. That is, in some embodiments, the second glass layer $\mathbf{910}_B$ is left unaltered, with no cavities 965. In the illustrated embodiment, each of the cavities 965 are shown as being substantially the same depth. However, it is to be appreciated that the depth of the various cavities 965 may be varied. It is to be appreciated that the metal between the third glass layer $\mathbf{910}_C$ and interface layer 922, between the second glass layer $\mathbf{910}_B$ and the interface layers 922, between the first glass layer $\mathbf{910}_A$ and the interface layer 922, and vias through the interface layers 1122 are omitted in order to simplify the Figure.

Figure 9B:
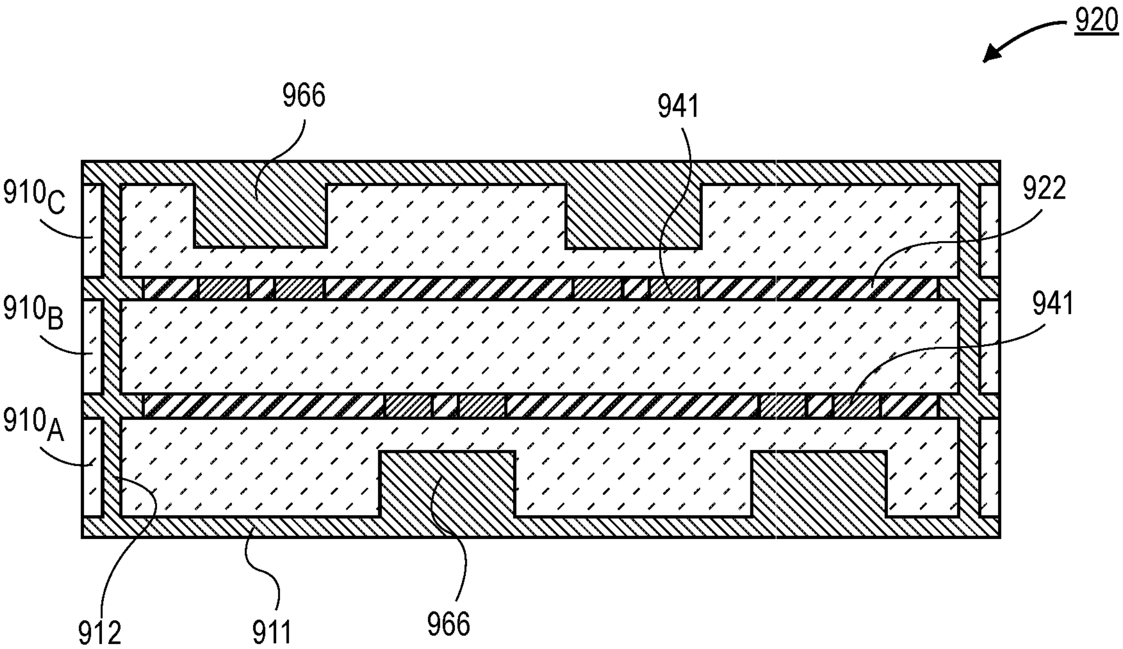
FIG. 9B is a cross-sectional illustration of the multi-layer glass core with conductive planes that fill in the cavities into the glass layers, in accordance with an embodiment.

Referring now to FIG. 9B, a cross-sectional illustration of the core 920 after conductive material is plated over the glass layers 910 is shown, in accordance with an embodiment. It is to be appreciated that metallization for the different layers will occur at different manufacturing operations, and FIG. 9B shows the completion of the core layers. In an embodiment, the conductive material may form ground planes 911. Conductive blocks 966 may also be provided in the location of the cavities 965. The conductive blocks 966 may be connected to each other by the ground planes 911. As such, the conductive blocks 966 are also held at the ground potential. The conductive blocks 966 reduce the distance between the traces 941 and the nearest ground reference. Such a configuration may be suitable for dual stripline routing. In some embodiments, ground vias 912 may also be provided through thicknesses of the glass layers 910.

Figure 9C:
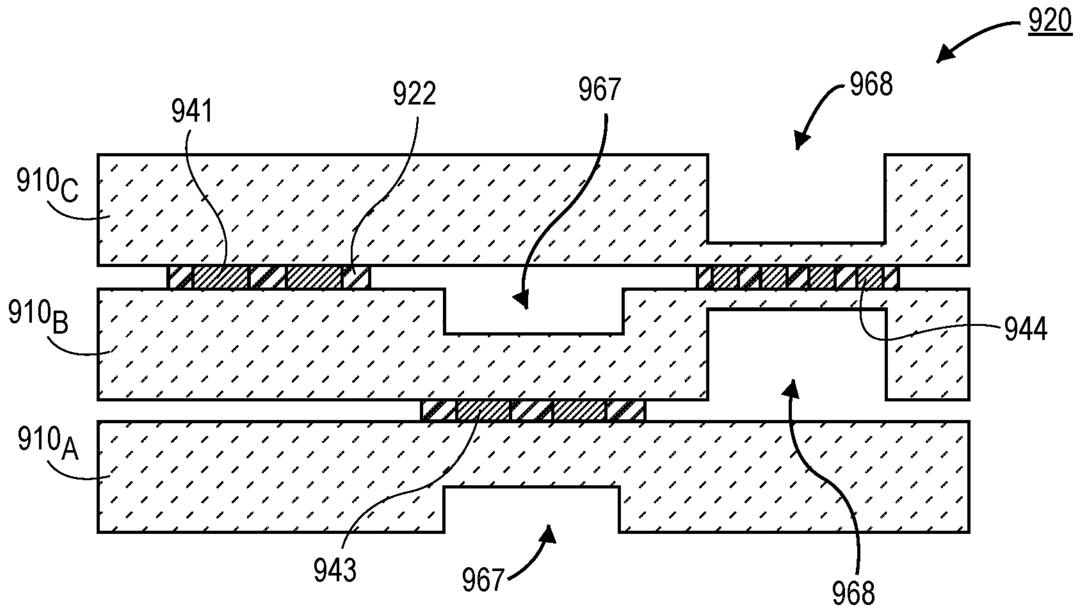
FIG. 9C is a cross-sectional illustration of a multi-layer glass core with a series of cavities into the glass layers over the signal routing traces, in accordance with an embodiment.

Referring now to FIG. 9C, a cross-sectional illustration of a multi-layer core 920 is shown, in accordance with yet another embodiment. In an embodiment, the core 920 may comprise a first glass layer $\mathbf{910}_A$, a second glass layer $\mathbf{910}_B$, and a third glass layer $\mathbf{910}_C$. Conductive traces 941 and 944 may be provided in interface layers 922 between the glass layers 910. Instead of providing a single type of signal routing architectures, embodiments allow for a plurality of different signal routing architectures. The difference in the routing types can be made by providing cavities 967 and 968 of different depths into the glass layers 910. As such, the distance to the ground plane can be modulated for each routing architecture.

In an embodiment, the pair of traces 941 on the far left side of the core 920 are suitable for ultra-low loss signaling (e.g., SerDes signaling). The low loss characteristic is provided because the distance to the ground planes will be the entire thickness of the second glass layer $\mathbf{910}_B$ and the third glass layer $\mathbf{910}_C$. The middle pair of traces 943 are suitable for high-density high-speed differential signaling. The cavities 967 in the first glass layer $\mathbf{910}_A$ and the second glass layer $\mathbf{910}_B$ reduce the distance between the traces 943 and the ground plane. On the far right, a set of traces 944 are suitable for high-density single ended signal routing. In such an embodiment, cavities 968 in the second glass layer $\mathbf{910}_B$ and the third glass layer $\mathbf{910}_C$ reduce the distance between the traces 944 and the ground plane. It is to be appreciated that the positioning of the traces 941 and 944 is provided as an example. That is, the traces 941 and 944 are not limited to the layers shown, nor is the sequential ordering of the traces 941 and 944 from left to right to be construed as limiting embodiments disclosed herein. It is to be appreciated that the metal between the third glass layer $\mathbf{910}_C$ and interface layer 922, between the second glass layer $\mathbf{910}_B$ and the interface layers 922, between the first glass layer $\mathbf{910}_A$ and the interface layer 922, and vias through the interface layers 1122 are omitted in order to simplify the Figure.

Figure 9D:
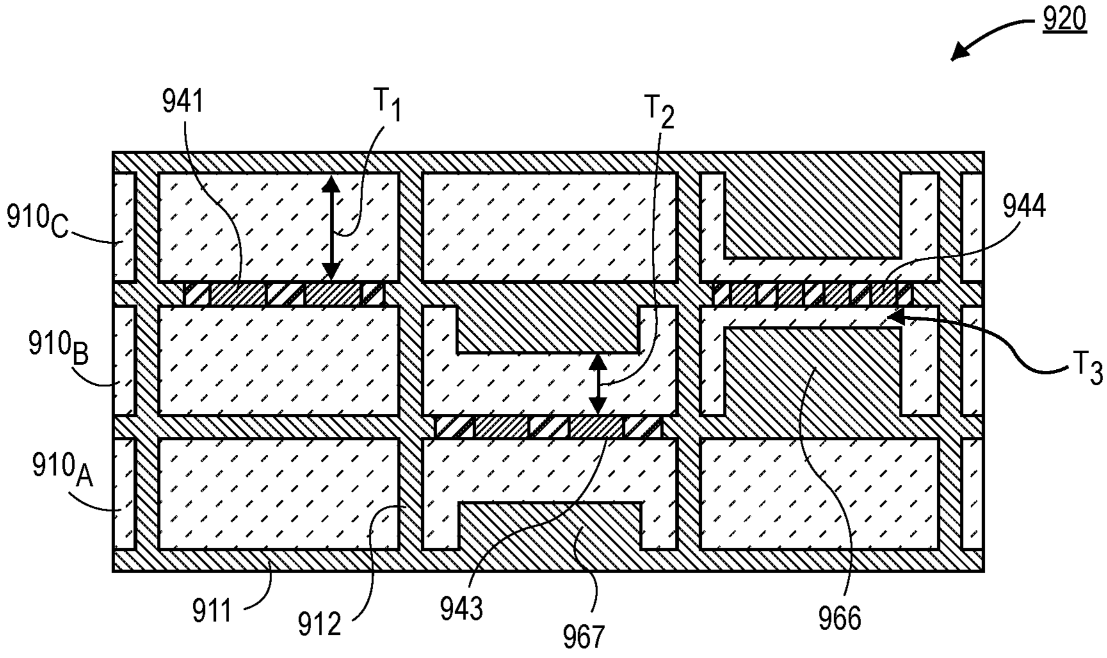
FIG. 9D is a cross-sectional illustration of the multi-layer glass core with conductive planes filling the cavities, in accordance with an embodiment.

Referring now to FIG. 9D, a cross-sectional illustration of the core 920 after the ground planes 911 are formed is shown, in accordance with an embodiment. As shown, conductive blocks 966 fill the cavities 967 and 968. The conductive blocks 966 may be held at ground potential by the ground planes 911 and the ground vias 912. Furthermore, each of the signaling architectures has a different distance to the ground. For example, traces 941 on the left are a distance $T_1$ from the ground plane 911, traces 943 in the middle are a distance $T_2$ from the ground plane/conductive blocks 911/966, and the traces 944 on the right are a distance $T_3$ from the ground plane/conductive blocks 911/966. In an embodiment, the distance $T_1$ is greater than the distance $T_2$, and the distance $T_2$ is greater than the distance $T_3$. The particular distances $T_1$-$T_3$ can be modulated by changing the thickness of the glass layers 910 and/or changing the depths of the cavities 967 and 968. In FIG. 9D, the distance to ground above and below the traces 941 and 944 are shown as being uniform. However, it is to be appreciated that the distance to ground above the traces 941 and 944 may be greater than, less than, or equal to the distance to ground below the traces 941 and 944. Additionally such a concept also applies for the ultra low-loss architecture if $\mathbf{910}_C$ and $\mathbf{910}_B$ are different thicknesses.

Referring now to FIGS. 10A-10D, a series of illustrations depicting a multi-layer core 1020 is shown, in accordance with additional embodiments. The core 1020 differ from those described above in that only two glass layers $\mathbf{1010}_A$ and $\mathbf{1010}_B$ are provided, and the interface layer 1022 is thicker. The thicker interface layer 1022 provides enough room to have a pair of routing layers. A first routing layer may be at the bottom of the interface layer 1022 on the first glass layer $\mathbf{1010}_A$, and a second routing layer may be at the top of the interface layer 1022 on the second glass layer $\mathbf{1010}_B$.

Figure 10A:
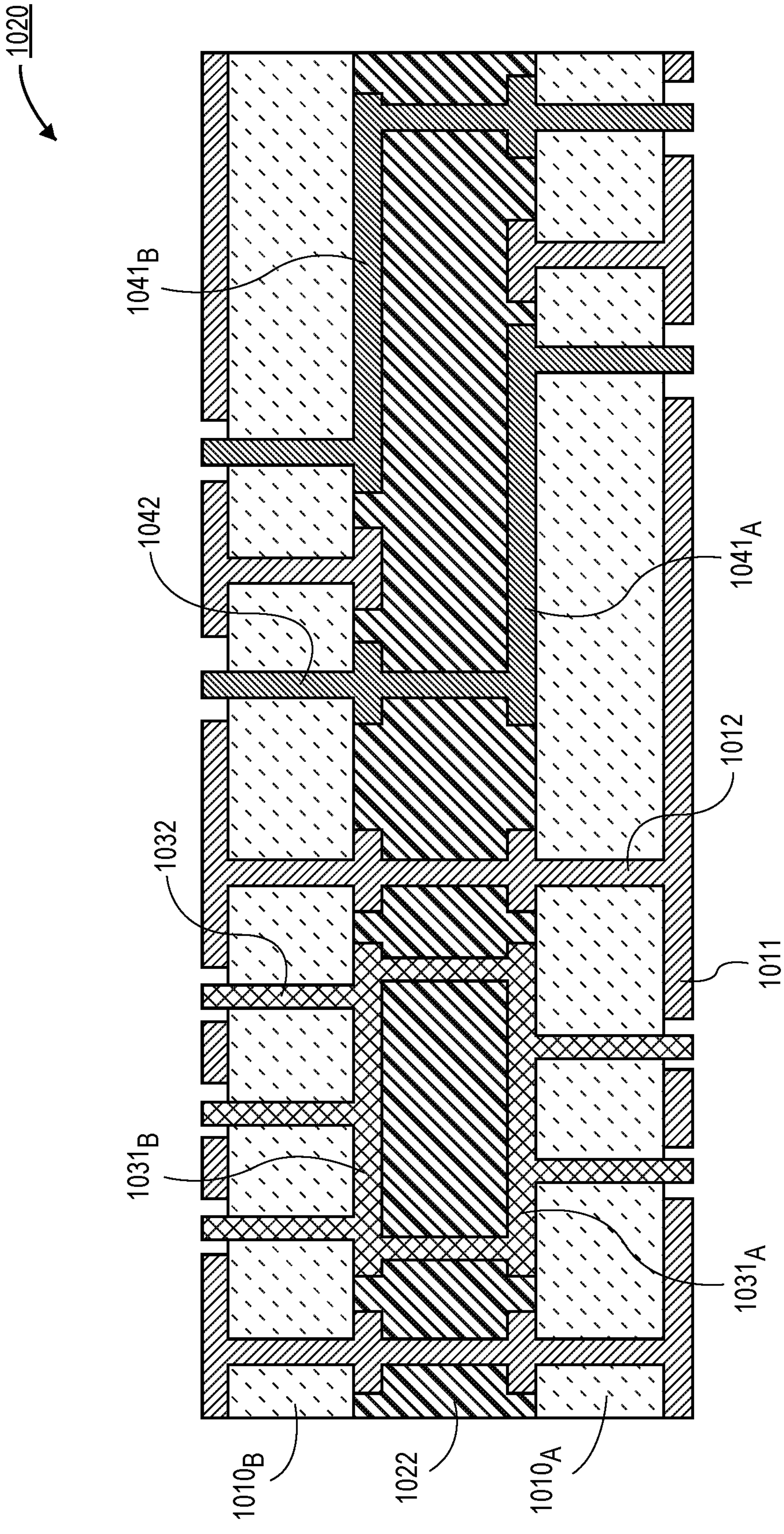
FIG. 10A is a cross-sectional illustration of a multi-layer glass core with a first glass layer, a second glass layer, and a thick adhesive layer, in accordance with an embodiment.

Referring now to FIG. 10A, a cross-sectional illustration of a multi-layer core 1020 is shown, in accordance with an embodiment. In an embodiment, the core 1020 comprises a first glass layer $\mathbf{1010}_A$ and a second glass layer $\mathbf{1010}_B$. In an embodiment, the first glass layer $\mathbf{1010}_A$ is coupled to the second glass layer $\mathbf{1010}_B$ by an interface layer 1022. In an embodiment, the interface layer 1022 may be an adhesive. While relatively thick (e.g., 20 μm-35 μm) the interface layer 1022 may be thinner than that of the glass layers $\mathbf{1010}_A$ and $\mathbf{1010}_B$ which may be 100 μm thick or more. In an embodiment, power traces 1031 and signaling traces 1041 are provided in the interface layer 1022. For example, a first power trace $\mathbf{1031}_A$ and a first signal trace $\mathbf{1041}_A$ may be provided at the bottom of the interface layer 1022, and a second power trace $\mathbf{1031}_B$ and a second signal trace $\mathbf{1041}_B$ may be provided at the top of the interface layer 1022. In an embodiment, ground planes 1011 may be provided above and below the core 1020. Additionally, ground vias 1012 may pass through the thicknesses of the glass layers $\mathbf{1010}_A$ and $\mathbf{1010}_B$ and the interface layer 1022.

In an embodiment, the power traces 1031 may be coupled to the top and bottom surfaces of the core by vias 1032. Similarly, vias 1042 may couple the signal traces 1041 to the top surface and the bottom surface of the core 1020. The signal traces $\mathbf{1041}_A$ and $\mathbf{1041}_B$ may each be coupled to the top surface of the core 1020 and the bottom surface of the core 1020. Such a configuration allows for connections to be made between an overlying die (not shown) and a board below the core 1020.

Figure 10B:
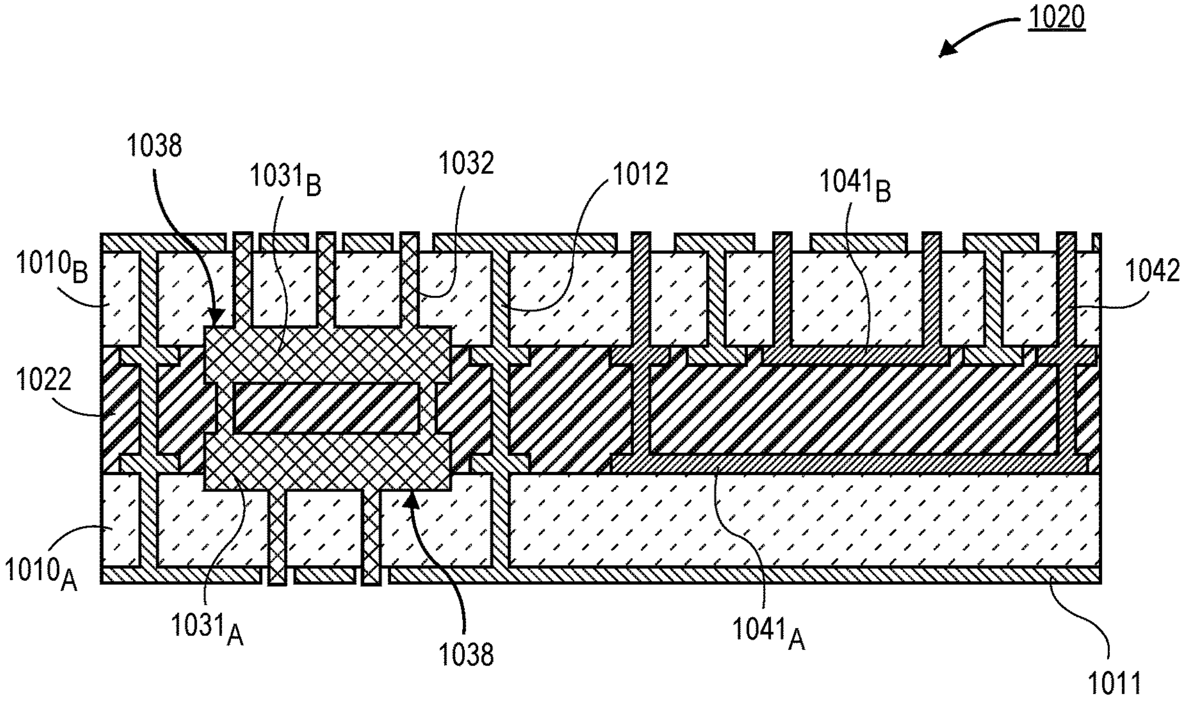
FIG. 10B is a cross-sectional illustration of a multi-layer glass core with power traces that are thicker than the signal routing traces, in accordance with an embodiment.

Referring now to FIG. 10B, a cross-sectional illustration of a multi-layer core 1020 is shown, in accordance with an additional embodiment. In an embodiment, the routing for the signal traces $\mathbf{1041}_A$ and $\mathbf{1041}_B$ includes routing between two die side components. That is, the vias 1042 only extend up to the topside of the core 1020. Such an embodiment allows for a die to be coupled to an adjacent die side component, such as a connector, an optical module, a die, a chiplet, or the like. In some embodiments, trace $\mathbf{1041}_A$ may alternatively be coupled from the top side (i.e., die side) to the bottom side (i.e., board side) by using a via 1042 that passes through the glass layer $\mathbf{1010}_A$. In yet another embodiment, trace $\mathbf{1041}_A$ may connect the die to the die side components, and the trace $\mathbf{1041}_B$ may connect the die side to the board side.

FIG. 10B also includes power traces 1031 that have a thickness that is greater than the thickness of the signal traces 1041. For example, the power trace $\mathbf{1031}_A$ extends into the first glass layer $\mathbf{1010}_A$. For example, a cavity 1038 may be formed in the first glass layer $\mathbf{1010}_A$ to accommodate the thicker trace $\mathbf{1031}_A$. Similarly, the top trace $\mathbf{1031}_B$ may extend into a cavity 1038 formed into the second glass layer $\mathbf{1010}_B$. Portions of the traces $\mathbf{1031}_A$ and $\mathbf{1031}_B$ may also extend further into the interface layer 1022 than the distance the traces $\mathbf{1041}_A$ and $\mathbf{1041}_B$ extend into the interface layer 1022. In yet another embodiment, the trace $\mathbf{1031}_A$ and the trace $\mathbf{1031}_B$ may merge together to form a single trace through the thickness of the interface layer 1022. Additionally, while referred to as traces, it is to be appreciated that traces $\mathbf{1031}_A$ and $\mathbf{1031}_B$ may optionally be planes.

Figure 10C:
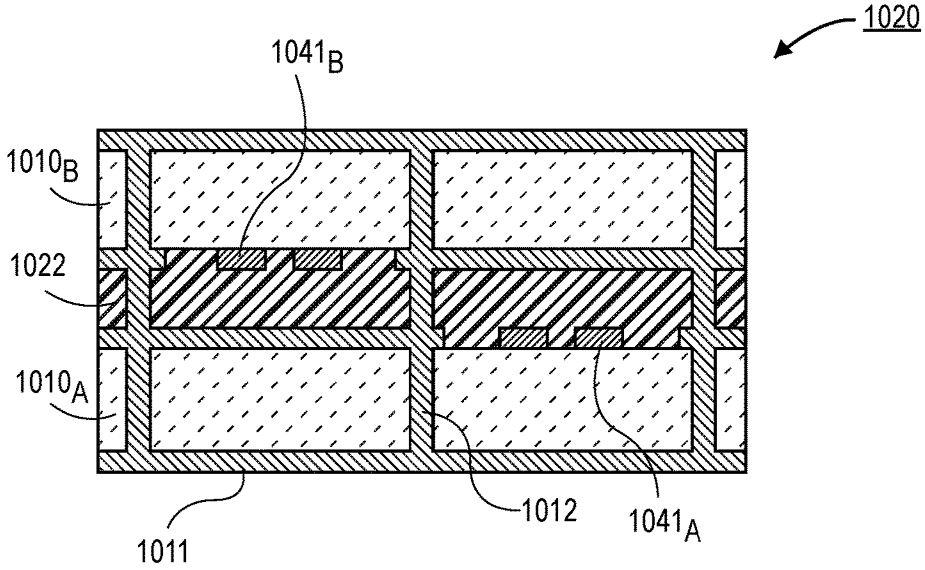
FIG. 10C is a cross-sectional illustration of the signal routing traces of the multi-layer glass core, in accordance with an embodiment.

Referring now to FIG. 10C, a cross-sectional illustration of a multi-layer core 1020 is shown, in accordance with an additional embodiment. In an embodiment, the core 1020 comprises a first glass layer $\mathbf{1010}_A$ and a second glass layer $\mathbf{1010}_B$. The first glass layer $\mathbf{1010}_A$ may be coupled to the second glass layer $\mathbf{1010}_B$ by an interface layer 1022, such as a buildup film. In an embodiment, signal traces $\mathbf{1041}_A$ and $\mathbf{1041}_B$ may be embedded in the interface layer 1022. For example, traces $\mathbf{1041}_A$ may be provided at the bottom of the interface layer 1022. The traces $\mathbf{1041}_A$ may include sidewall surfaces and a top surface that is directly contacted by the interface layer 1022. A bottom surface of the traces $\mathbf{1041}_A$ may be directly contacted by the first glass layer $\mathbf{1010}_A$. The traces $\mathbf{1041}_B$ may be provided at the top of the interface layer 1022. The traces $\mathbf{1041}_B$ may include sidewall surfaces and a bottom surface that is directly contacted by the interface layer 1022. A top surface of the traces $\mathbf{1041}_B$ may be directly contacted by the second glass layer $\mathbf{1010}_B$. As shown, ground planes 1011 may be provided over and under the core 1020. Ground vias 1012 may pass through a thickness of the core 1020.

Figure 10D:
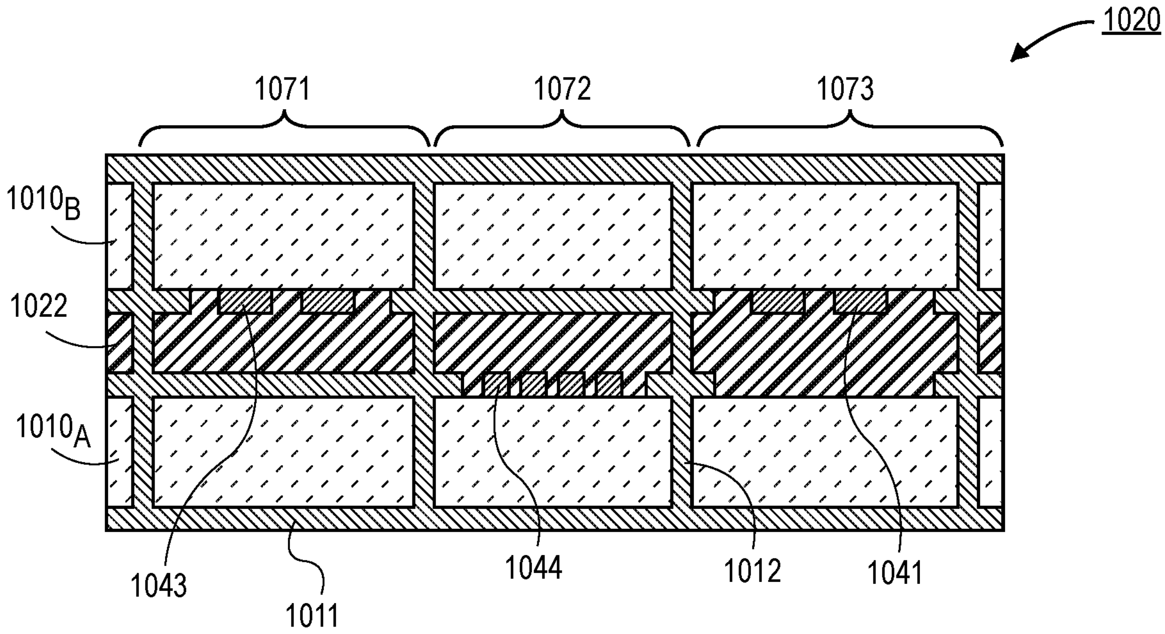
FIG. 10D is a cross-sectional illustration of the signal routing traces with different routing architectures within a single multi-layer glass core, in accordance with an embodiment.

Referring now to FIG. 10D, a cross-sectional illustration of a multi-layer core 1020 is shown, in accordance with an additional embodiment. As shown in FIG. 10D, a plurality of different routing architectures may be included within a single core 1020. For example, three different routing architectures 1071, 1072, and 1073 are shown in FIG. 10D. The first routing architecture 1071 may be a low loss SerDes type routing architecture. In such an embodiment, traces 1043 may be separated from a ground plane by the second glass layer $\mathbf{1010}_B$ on one side and by the interface layer 1022 on the other side. The second routing architecture 1072 may be a high-density single ended signaling architecture. As shown, a plurality of traces 1044 may be adjacent to each other and within the interface layer 1022. In an embodiment, the traces 1044 are close to the ground plane 1011 at the top of the interface layer 1022. In an embodiment, the third routing architecture 1073 is an ultra-low loss signaling architecture (e.g., suitable for SerDes signaling). As shown, the traces 1041 are spaced away from the nearest ground plane 1011 by at least the thickness of the second glass layer $\mathbf{1010}_B$. On the other side, the ground plane 1011 is spaced away from the traces 1041 by the thickness of the first glass layer $\mathbf{1010}_A$ and the thickness of the interface layer 1022. Additionally, the distance between the traces 1041 and 1044 may be modulated using blind cavities that are filled with metal, similar to embodiments described in greater detail above.

Figure 11A:
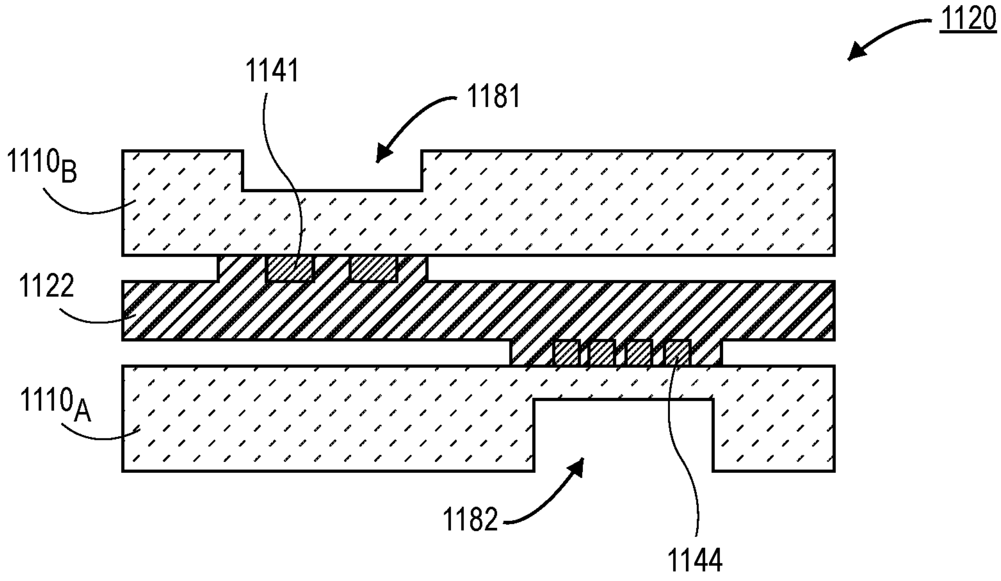
FIG. 11A is a cross-sectional illustration of a multi-layer glass core with cavities in the glass layers over the signal traces, in accordance with an embodiment.
Figure 11B:
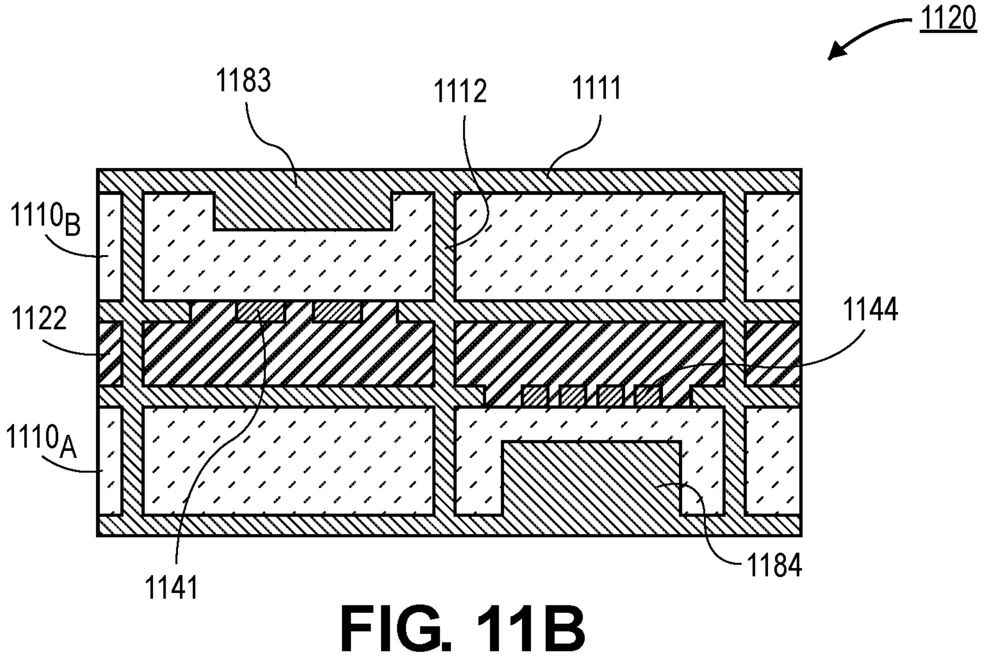
FIG. 11B is a cross-sectional illustration of the multi-layer glass core with a conductive plane filling the cavities in the glass layers, in accordance with an embodiment.

Referring now to FIGS. 11A and 11B, cross-sectional illustrations of a multi-layer core 1120 with cavities to reduce the distance between the traces and the ground plane are shown, in accordance with an embodiment. By controlling the depth of the cavity, different types of routing architectures can be enabled within a single core 1120.

Referring now to FIG. 11A, a cross-sectional illustration of a multi-layer core 1120 is shown, in accordance with an embodiment. In an embodiment, the core 1120 comprises a first glass layer $\mathbf{1110}_A$ and a second glass layer $\mathbf{1110}_B$. An interface layer 1122 is provided between the glass layers $\mathbf{1010}_A$ and $\mathbf{1010}_B$. In an embodiment, traces 1141 and traces 1144 may be provided in the interface layer 1122. As shown, a first cavity 1181 is provided in the second glass layer $\mathbf{1110}_B$ over the traces 1141, and a second cavity 1182 is provided in the first glass layer $\mathbf{1110}_A$ below the traces 1144. In an embodiment, the depth of the second cavity 1182 is greater than a depth of the first cavity 1181. It is to be appreciated that the metal between the second glass layer $\mathbf{1110}_B$ and interface layer 1122, between the first glass layer $\mathbf{1110}_A$ and the interface layer 1122, and vias through the interface layer 1122 are omitted in order to simplify the Figure.

Referring now to FIG. 11B, a cross-sectional illustration of the core 1120 in FIG. 11A after the ground planes 1111 are formed is shown, in accordance with an embodiment. In an embodiment, the ground planes 1111 may be coupled to conductive blocks 1183 and 1184. The conductive blocks 1183 and 1184 fill the cavities 1181 and 1182. Since they are electrically coupled to the ground planes 1111, the conductive blocks 1183 and 1184 can decrease the distance between the traces 1141 and 1144 and the ground In an embodiment, the distance between the traces 1144 and the ground is smaller than the distance between the traces 1141 and the ground Furthermore, it is to be appreciated that the metal of the conductive blocks 1183 and 1184 would typically be deposited with different deposition processes than the processes used to form the vias 1112 through the interface layer 1122, and the metal between the glass layers $\mathbf{1110}_{A\text{-}B}$ and the interface layer 1122.

Figure 12A:
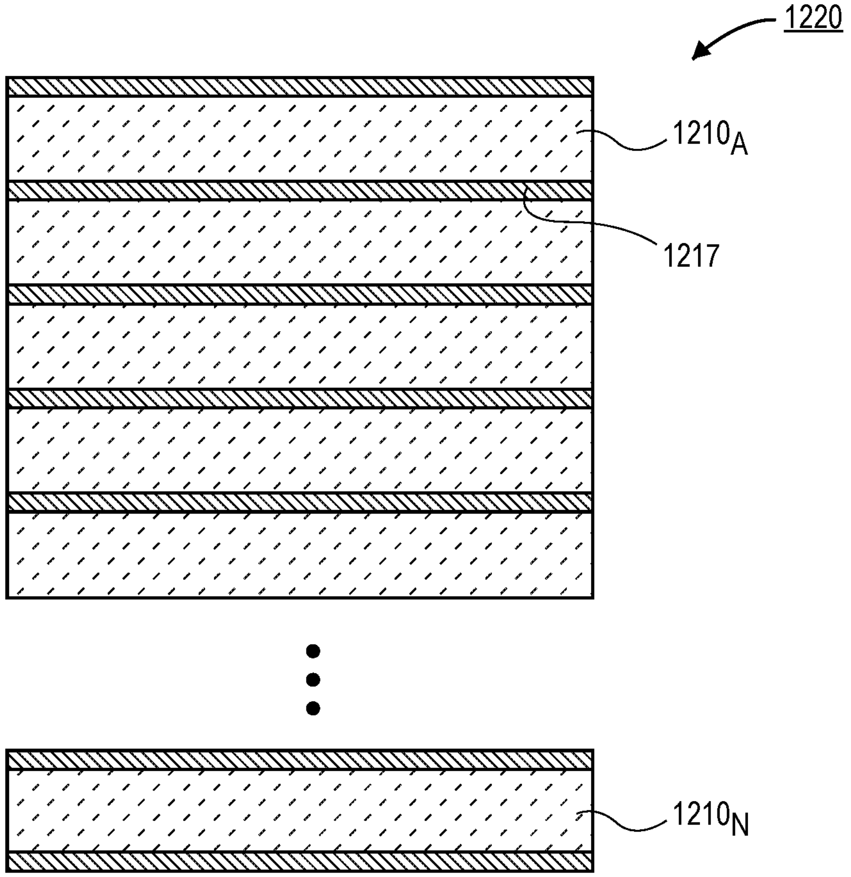
FIG. 12A is a cross-sectional illustration of a multi-layer glass core, in accordance with an embodiment.

Referring now to FIG. 12A, a cross-sectional illustration of a multi-layer core 1220 is shown, in accordance with an additional embodiment. Particularly, the multi-layer core 1220 includes a plurality of glass layers $\mathbf{1210}_A$ to $\mathbf{1210}_N$. Metal layers 1217 may be between the glass layers $\mathbf{1210}_A$ to $\mathbf{1210}_N$. Such an embodiment illustrates that there need not be any particular number of glass layers 1210. The number of glass layers may be dependent on the routing needs of a given package architecture. In an embodiment, any of the routing architectures described herein can be modified to be used with a multi-layer core 1220 with a plurality of glass layers 1210. In an embodiment, adhesive interface layers (not shown) may also be provided between the glass cores 1210 to fill gaps in the metal layers 1217.

Figure 12B:
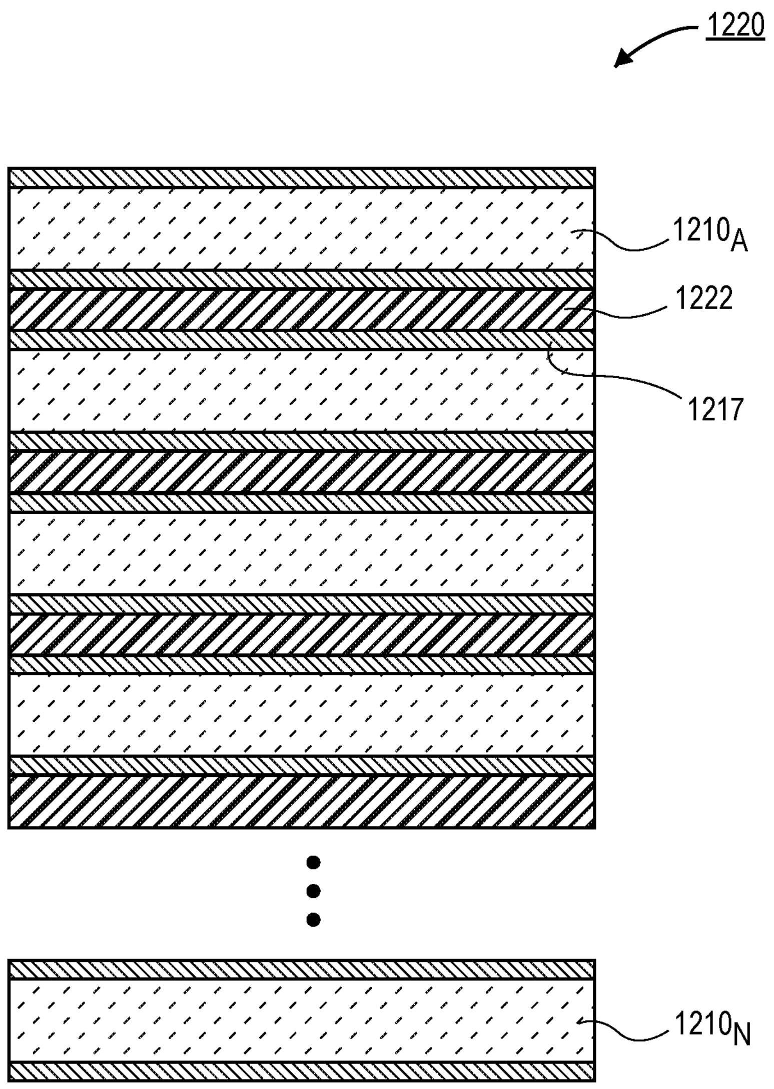
FIG. 12B is a cross-sectional illustration of a multi-layer glass core with adhesive layers between the glass layers, in accordance with an embodiment.

Referring now to FIG. 12B, a cross-sectional illustration of a multi-layer core 1220 is shown, in accordance with an additional embodiment. Similar to the embodiment shown in FIG. 12A, there may be any number of glass layers $\mathbf{1210}_A$ to $\mathbf{1210}_N$ with metal layers 1217 therebetween. However, the embodiment in FIG. 12B may also include interface layers 1222 between each of the glass layers 1210. The interface layers 1222 may comprise a buildup film or other adhesive material. In an embodiment, any of the routing architectures described herein can be modified to be used with a multi-layer core 1220 with a plurality of glass layers 1210. Additionally, it is to be appreciated that the embodiment shown in FIG. 12B may be used in conjunction with the embodiment shown in FIG. 12A to provide a hybrid core.

Figure 13:
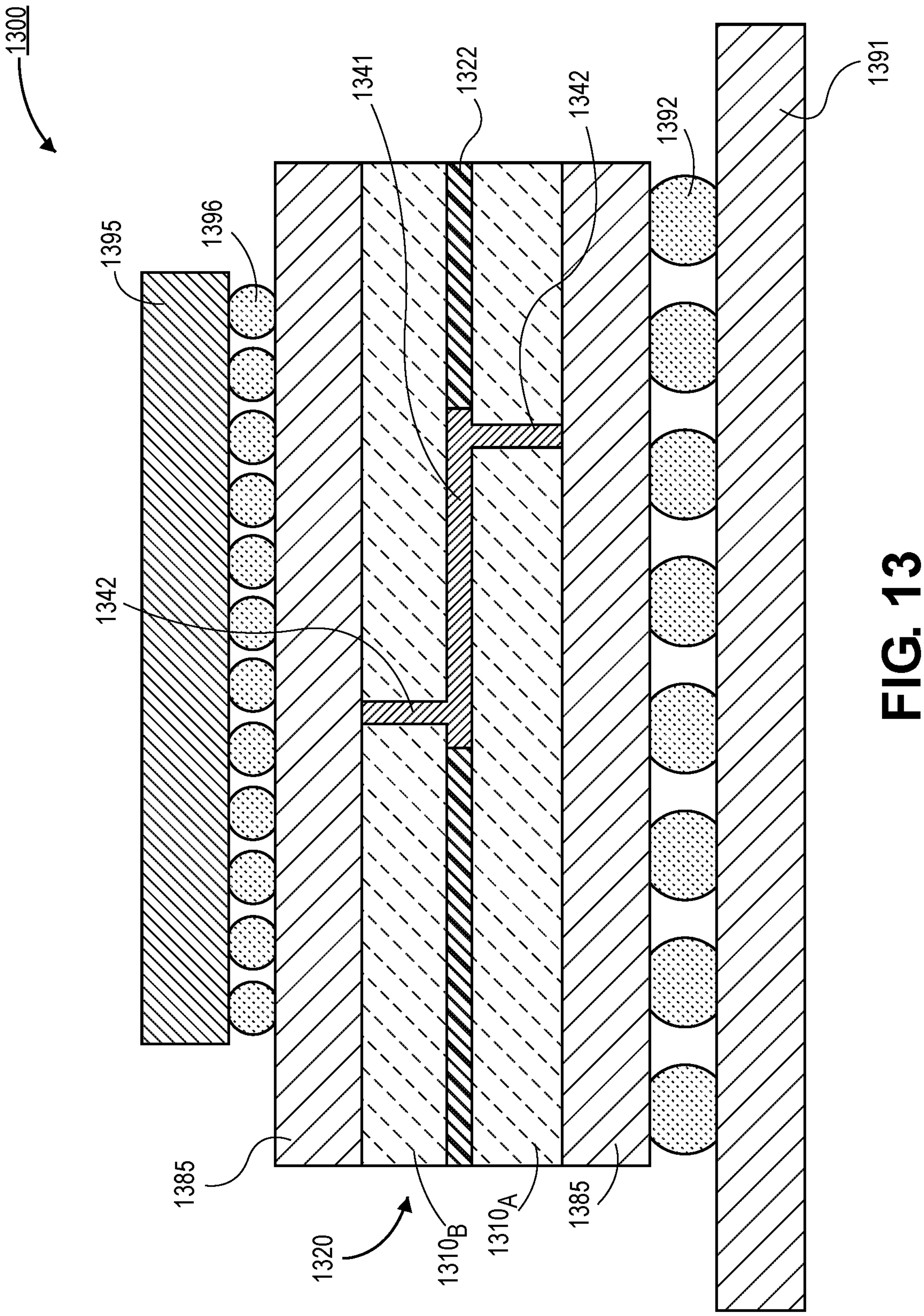
FIG. 13 is a cross-sectional illustration of an electronic system with a package substrate with a multi-layer glass core, in accordance with an embodiment.

Referring now to FIG. 13, a cross-sectional illustration of an electronic system 1300 is shown, in accordance with an embodiment. In an embodiment, the electronic system 1300 may comprise a board 1391, such as a printed circuit board (PCB) or the like. A package substrate may be coupled to the board 1391 by interconnects 1392. While shown as solder balls, it is to be appreciated that interconnects 1392 may be any interconnect architecture, such as sockets or the like.

In an embodiment, the package substrate comprises a multi-layer core 1320 and buildup layers 1385 above and below the core 1320. The core 1320 may comprise a first glass layer $1310_A$ and a second glass layer $1310_B$. The first glass layer $1310_A$ may be coupled to the second glass layer $1310_B$ by an interface layer 1322. A trace 1341 may be provided in the interface layer 1322. Vias 1342 may couple the trace 1341 to routing in the buildup layers 1385 above and below the core 1320. For example, routing in the top buildup layers 1385 may couple the trace 1341 to a die 1395, and routing in the bottom buildup layers 1385 may couple the trace 1341 to the board 1391. In an embodiment, the die 1395 is coupled to the package substrate by interconnects 1396. The interconnects 1396 may be any suitable first level interconnect architecture. In the particular embodiment shown in FIG. 13, the core 1320 includes a pair of glass layers. However, it is to be appreciated that any multi-layer core architecture disclosed herein may be used in the electronic system 1300.

Figure 14:
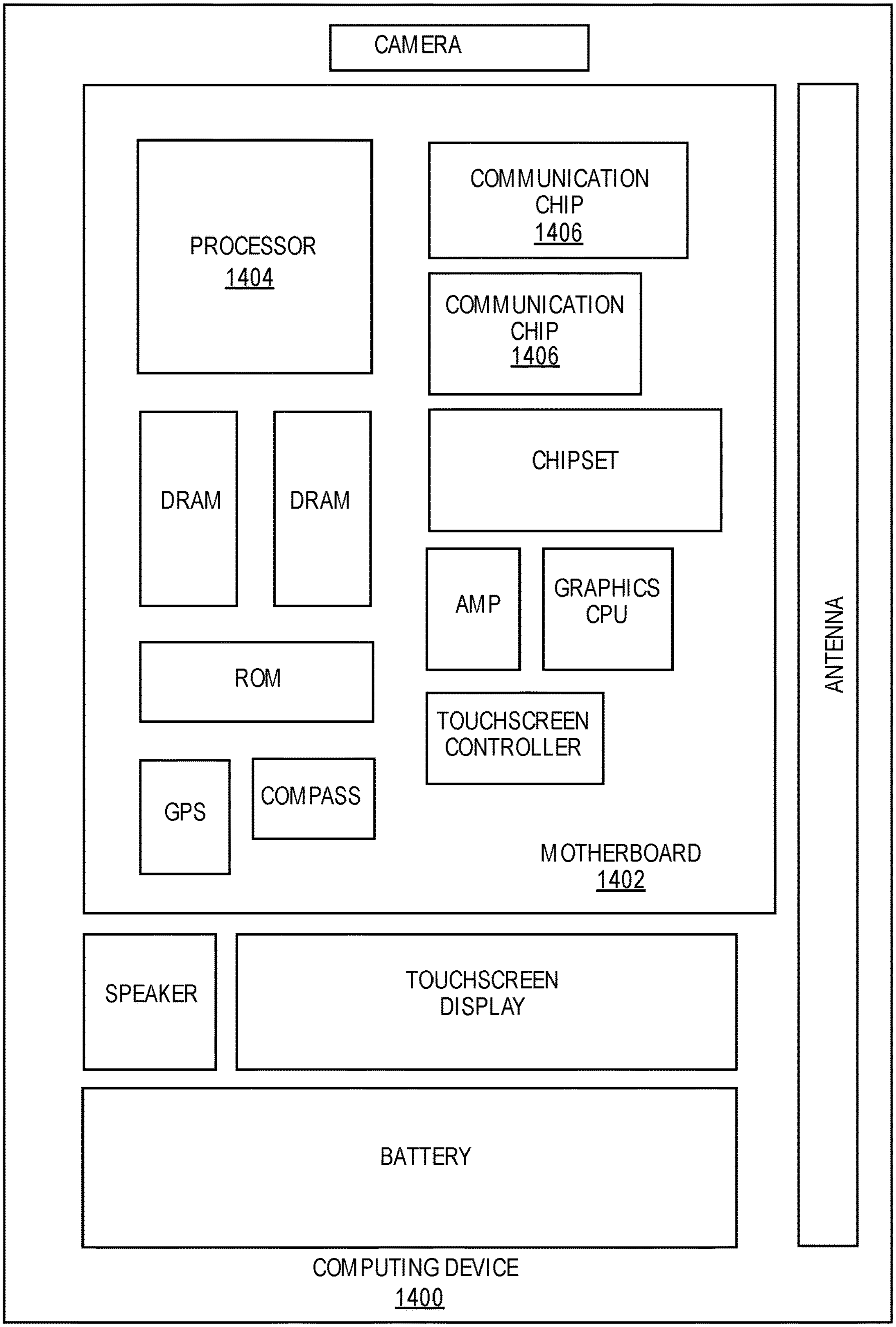
FIG. 14 is a schematic of a computing device built in accordance with an embodiment.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the invention, the integrated circuit die of the processor may be part of an electronic package that comprises a multi-layer core with signal and/or power routing in an interface layer between glass layers, in accordance with embodiments described herein. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the invention, the integrated circuit die of the communication chip may be part of an electronic package that comprises a multi-layer core with signal and/or power routing in an interface layer between glass layers, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first layer comprising glass; a second layer comprising glass over the first layer; and an inductor between the first layer and the second layer.

Example 2: the electronic package of Example 1, further comprising: a first via through the first layer and coupled to a first end of the inductor; a second via through the second layer and coupled to a second end of the inductor.

Example 3: the electronic package of Example 1, further comprising: a first via through the first layer and coupled to a first end of the inductor; and a second via through the first layer and coupled to the second end of the inductor.

Example 4: the electronic package of Examples 1-3, wherein the inductor comprises a coil.

Example 5: the electronic package of Examples 1-4, wherein the inductor comprises a first coil and a second coil, wherein the first coil and the second coil are electrically connected to each other in series.

Example 6: the electronic package of Examples 1-5, wherein the inductor is a vertically oriented inductor, and wherein the inductor comprises two or more vias through an interface layer between the first layer and the second layer, and wherein ends of the two or more vias are coupled together by traces.

Example 7: the electronic package of Example 6, further comprising: a first magnetic material around the two or more vias.

Example 8: the electronic package of Example 7, further comprising: a second magnetic material around the traces.

Example 9: the electronic package of Examples 1-8, further comprising: an adhesive between the first layer and the second layer.

Example 10: the electronic package of Examples 1-9, wherein a magnetic material is provided above and below the inductor.

Example 11: the electronic package of Examples 1-10, further comprising: a second inductor between the first layer and the second layer.

Example 12: the electronic package of Example 11, wherein the second inductor is above the inductor.

Example 13: the electronic package of Example claim 12, wherein a via couples the inductor to the second inductor.

Example 14: the electronic package of Example 11, further comprising: a first magnetic material around the inductor; and a second magnetic material around the second inductor.

Example 15: an electronic package, comprising: a core, wherein the core comprises: a first layer comprising glass; an adhesive over the first layer; a second layer comprising glass coupled to the first layer by the adhesive; and wherein a first region at a center of the core is for power routing and comprises an inductor, and wherein a second region around the first region is for signal routing, and routing layers above and below the core.

Example 16: the electronic package of Example 15, further comprising a first via through the first layer and coupled to a first end of the inductor; a second via through the second layer and coupled to a second end of the inductor.

Example 17: the electronic package of Example 15 or Example 16, wherein the inductor comprises a coil.

Example 18: the electronic package of Examples 15-17, wherein the inductor comprises a first coil and a second coil, wherein the first coil and the second coil are electrically connected to each other in series.

Example 19: the electronic package of Examples 15-18, wherein a magnetic material is provided above and below the inductor.

Examples 20: the electronic package of Examples 15-19, further comprising: a second inductor between the first layer and the second layer.

Example 21: the electronic package of Example 20, wherein the second inductor is above the inductor.

Example 22: the electronic package of Example 21, wherein a via couples the inductor to the second inductor.

Example 23: an electronic system, comprising: a board; a package substrate coupled to the board, wherein the package substrate comprises: a first layer comprising glass; a second layer comprising glass over the first layer; and an inductor between the first layer and the second layer; and a die coupled to the package substrate.

Example 24: electronic system of Example 23, wherein the inductor is within a footprint of the die.

Example 25: the electronic system of Example 23 or Example 24, wherein the inductor is a non-planar inductor.

What is claimed is:

1. An electronic package, comprising:

a first layer comprising glass;

a second layer comprising glass over the first layer comprising glass;

an inductor between the first layer comprising glass and the second layer comprising glass; and a magnetic material above and below the inductor, the magnetic material extending into the first layer comprising glass and extending into the second layer comprising glass.

2. The electronic package of claim 1, further comprising:

a first via through the first layer comprising glass and coupled to a first end of the inductor;

a second via through the second layer comprising glass and coupled to a second end of the inductor.

3. The electronic package of claim 1, further comprising:

a first via through the first layer comprising glass and coupled to a first end of the inductor; and a second via through the first layer comprising glass and coupled to the second end of the inductor.

4. The electronic package of claim 1, wherein the inductor comprises a coil.

5. The electronic package of claim 1, wherein the inductor comprises a first coil and a second coil, wherein the first coil and the second coil are electrically connected to each other in series.

6. The electronic package of claim 1, wherein the inductor is a vertically oriented inductor, and wherein the inductor comprises two or more vias through an interface layer between the first layer comprising glass and the second layer comprising glass, and wherein ends of the two or more vias are coupled together by traces.

7. The electronic package of claim 6, further comprising:

a first magnetic material around the two or more vias.

8. The electronic package of claim 7, further comprising:

a second magnetic material around the traces.

9. The electronic package of claim 1, further comprising:

an adhesive between the first layer comprising glass and the second layer comprising glass.

10. The electronic package of claim 1, further comprising:

a second inductor between the first layer comprising glass and the second layer comprising glass.

11. The electronic package of claim 10, wherein the second inductor is above the inductor.

12. The electronic package of claim 11, wherein a via couples the inductor to the second inductor.

13. The electronic package of claim 10, further comprising:

a first magnetic material around the inductor; and a second magnetic material around the second inductor.

* * * * *